(12) United States Patent
Yagisawa et al.

(10) Patent No.: US 7,443,279 B2
(45) Date of Patent: Oct. 28, 2008

(54) COIL PACKAGE AND BIAS TEE PACKAGE

(75) Inventors: Takatoshi Yagisawa, Kawasaki (JP);
Tadashi Ikeuchi, Kawasaki (JP);
Yasuhide Kuroda, Kawasaki (JP);
Tszshing Cheung, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 477 days.

(21) Appl. No.: 11/366,625

(22) Filed: Mar. 3, 2006

(65) Prior Publication Data
US 2007/0164843 A1   Jul. 19, 2007

(30) Foreign Application Priority Data
Oct. 13, 2005   (JP) .............. 2005-298347

(51) Int. Cl.
*H01F 27/28* (2006.01)
*H03H 7/00* (2006.01)

(52) U.S. Cl. ............... 336/231; 336/225; 336/232; 333/185

(58) Field of Classification Search .......... 333/185, 333/181; 336/200, 223, 231, 225; 174/52.1, 174/52.2
See application file for complete search history.

(56) References Cited
U.S. PATENT DOCUMENTS
6,236,289 B1   5/2001   Slenker
6,344,781 B1   2/2002   Slenker
2002/0057183 A1 * 5/2002   Oldfield .............. 336/231
2002/0080002 A1 * 6/2002   Oldfield et al. ........ 336/231
2005/0093670 A1 * 5/2005   Neumann et al. ....... 336/208

OTHER PUBLICATIONS

Patent Abstracts of Japan, Publication No. 2004-193886, Published Jul. 8, 2004.
Patent Abstracts of Japan, Publication No. 2004-172517, Published Jun. 17, 2004.
Patent Abstracts of Japan, Publication No. 2005-079286, Published Mar. 24, 2005.

* cited by examiner

*Primary Examiner*—Anh T Mai
(74) *Attorney, Agent, or Firm*—Staas & Halsey LLP

(57) ABSTRACT

A coil package which makes it easy to handle a high-frequency cone/pyramid-shaped coil and enhance frequency characteristics without degrading the characteristics of the coil. The cone/pyramid-shaped coil has a conical or pyramidal shape formed by wiring a conductor wire around an outer peripheral surface of a core such that the winding diameter of the coil progressively decreases from one end to the other end of the coil. The coil and a dielectric substrate are integrated with each other by forming a hole for inserting a tip portion of the coil in the dielectric substrate, making the bottom of the hole and a back surface of the dielectric substrate electrically continuous by a via, placing the coil in the hole by directing a small-diameter side of the cone/pyramid-shaped coil to the hole, electrically connecting the bottom of the hole and a tip-side lead wire extending from the coil to each other, and connecting an electrode on a large-diameter side of the coil to an electrode on the dielectric substrate.

11 Claims, 20 Drawing Sheets

COIL PACKAGE AND BIAS TEE PACKAGE

CROSS-REFERENCE TO RELATED APPLICATIONS

This application is based upon and claims the benefits of priority from the prior Japanese Patent Application No. 2005-298347, filed on Oct. 13, 2005, the entire contents of which are incorporated herein by reference.

BACKGROUND OF THE INVENTION

1. Field of the Invention

This invention relates to a coil package and a bias tee package, and more particularly to a coil package having a high-frequency coil mounted therein, and a broadband bias tee package for supplying a high-frequency signal by superposing a DC component on the high-frequency signal.

2. Description of the Related Art

Recently, with the development of multi-media technology, there is an increasing demand for constructing optical communication networks that transmit high-speed, large-volume information at low costs over long distances. To meet the demand, there have been developed optical communication systems whose transmission rate is in the order of 10 Gb/s, and further, as high-speed, large-volume communication means, optical communication systems whose transmission rate is in the order of 40 Gb/s are under development.

On the other hand, an electronic circuit called a bias tee is used in optical transmitter-receivers, measurement equipment, and so forth. The bias tee is comprised of a coil and a capacitor, and supplies a high-frequency signal by superposing a DC component, e.g. a DC current or a DC voltage, on the high-frequency signal, without adversely affecting the high-frequency signal.

In the bias tee for use in optical communication at a transmission rate of 10 Gb/s or less ($\leqq$10 Gb/s), it is possible to use a small-sized surface-mount coil (surface-mount type having a size of approximately 1.0 mm×0.5 mm) that can be directly mounted on a printed circuit board, as the coil (inductor) forming the bias tee. If the bias tee is used in optical communication at a transmission rate of 10 Gb/s or less, there occurs no marked degradation in frequency characteristics even when such a coil is used.

However, in performing optical communication at a transmission rate in the order of 40 Gb/s beyond the order of 10 Gb/s, it is impossible to use a coil of the above-mentioned type, since a parasitic capacitance of the coil itself and earth capacitances thereof cannot be ignored and a self-resonance frequency thereof forms a stumbling block to the use in such an optical communication.

FIG. 17 is a diagram showing an equivalent circuit of a coil. The coil 100 includes not only its inherent inductance but also capacitors (parasitic capacitance or line capacitance) formed by wound electric wires per se, winding resistance, and so forth.

An equivalent circuit 100a of the coil 100 can be defined as a circuit in which a coil L0 and a resistance R0 are connected in series, and a part formed by series connection of L0 and R0 and a capacitor Cr are connected in parallel. Further, when lead wires of the coil 100 are mounted on a printed circuit board, earth capacitances appear at respective locations of pads (copper foils for soldering, for use in mounting a component on a printed circuit board), and therefore the equivalent circuit 100a looks as if it has capacitors C1 and C2 connected between the lead wires and ground GND.

The parasitic capacitance of the capacitor Cr assumes a very small value, and hence it raises no problem when the coil 100 is used with low frequency. However, when the coil 100 is used as a high-frequency circuit, the parasitic capacitance cannot be ignored.

This is because the impedance Z of the coil is equal to $2\pi fL$ ($Z=2\pi fL$), and hence as the frequency f becomes higher, the impedance Z becomes larger, whereas when the frequency f is equal to a certain frequency $f_0$ (self-resonance frequency), the inherent inductance L of the coil and the parasitic capacitance of the capacitor Cr cause a resonance phenomenon, so that as the frequency f becomes higher, the parasitic capacitance becomes dominant to lower the impedance Z.

Therefore, in a frequency range higher than the self-resonance frequency $f_0$ as a point of reverse curve, the impedance Z is lowered, so that the coil no longer serves as a desired inductor.

Further, $f_0 = \frac{1}{2\pi}(LC)^{1/2}$ holds, so that as L and C are smaller, the self-resonance frequency $f_0$ becomes higher, and the point of reverse curve causing a resonance phenomenon becomes higher. This widens a usable frequency range (the coil 100 can be used for higher frequency uses), whereas when C becomes larger (when the parasitic capacitance of the capacitor Cr and the earth capacitances of the capacitors C1 and C2 become larger), the self-resonance frequency $f_0$ becomes lower, and the point of reverse curve causing a resonance phenomenon becomes smaller. This narrows the usable frequency range (the coil 100 cannot be used for high-frequency uses).

As described above, although the bias tee including the above-mentioned coil 100 can be used in optical communication where the transmission rate is in the order of 10 Gb/s, it cannot be used in optical communication at a transmission rate of 20 Gb/s or higher. To overcome this problem, in recent high-speed optical communication systems, a so-called conical coil which has a high self-resonance frequency has come into use.

FIG. 18 is a diagram showing the outline of the conical coil. The conical coil 110 has a conical shape and is formed by winding a conductor wire 111 covered with an insulating film, around an outer peripheral surface of a conical core 112 made of a resin material, such that the winding diameter of the conductor wire progressively decreases from one end to the other end of the coil (from the right end to the left end, as viewed in FIG. 18). Further, the opposite ends of the conductor wire 111 have the insulating film peeled off to expose copper wire 111a, for use as terminals.

FIG. 19 is a diagram showing an equivalent circuit of the conical coil 110. The equivalent circuit 110a of the conical coil 110 is configured such that coils L1 to Ln having different inductances are connected in series. In this case, the coils L1 to Ln of the conical coil 110 are sequentially arranged in series in the increasing order of the inductance, when viewed from the tip side of the conical shape.

The conical coil 110 is characterized in that it can ensure broadband characteristics of approximately several hundreds of KHz to several tens of GHz, and since the tip thereof has a small diameter, the value of inductance thereof is small and the parasitic capacitance thereof is held small, whereby it is possible to maintain its characteristics up to a high frequency of several tens of GHz.

It should be noted that the conical coil 110 has its highest frequency characteristics determined by the coil L1, and the frequency characteristics in a higher to a lower frequency bands are sequentially determined by the coil L1 to the coil Ln, respectively.

More specifically, the conical coil 110 is configured such that the high frequency characteristics are determined by the value of inductance of the coil L1, which is the first and smallest-diameter coil on the tip side of the conical coil 110 (the high frequency characteristics can be maintained by the coil L1 since the coil L1 has a small diameter and hence has a small inductance value), and the frequency characteristics of the conical coil 110 from a higher to a lower frequency band are sequentially determined by the inductance values of the coils whose diameter increases from the coil L1 to the coil Ln.

A prior art bias tee formed by using the conical coil has been proposed e.g. in Japanese Laid-Open Patent Publication (Kokai) No. 2004-193886 (Paragraph numbers [0014] and [0019], and FIG. 1).

FIG. 20 is a diagram showing a manner of bonding the conical coil 110. The tip of the conical coil 110 is bonded (press-fitted) on a circuit board by heat or ultrasonic waves.

However, in general, the conical coil 110 is compact in size, i.e. approximately several mm long in the direction of the length thereof. Further, the conical coil 110 has an unstable shape, since the wire of winding thereof is thin, i.e. has a diameter of approximately several tens of μm. Therefore, the conical coil 110 is generally mounted in an IC package. Further, it is necessary to connect the conical coil 110 by accurate bonding manually performed by a skilled worker. Therefore, it can be used in limited areas or locations of devices, and is very difficult to handle.

Further, a lead wire can be extended from the tip of the conical coil 110 only by several hundreds of μm, and if it is further extended, the high frequency characteristics of the conical coil are degraded. Moreover, the characteristics of the conical coil 110 vary with the mounting angle thereof, and hence there is a problem that a large variation in the characteristics is caused when the conical coil 110 is mounted.

Furthermore, conventionally, the conical coil 110 cannot be subjected to reflow (reflow: to supply necessary amounts of solders having various shapes on a pattern of a printed circuit board, and collectively thermally fuse the solders by a heat source, to thereby metallically bond electronic components to the circuit board for electric conduction). Therefore, the conical coils 110 are mounted on circuit boards one by one, by bonding, which makes it impossible to expect improvement of productivity.

SUMMARY OF THE INVENTION

The present invention has been made in view of the above points, and an object thereof is to provide a coil package which has a conical coil packaged therein without degrading the characteristics of the conical coil, thereby being made easy to handle, and being enhanced in frequency characteristics.

Another object of the present invention is to provide a bias tee package which has a conical coil and a capacitor packaged therein without degrading the characteristics of the conical coil, thereby being made easy to handle, and being enhanced in frequency characteristics.

To attain the above object, there is provided a coil package having a coil mounted therein. The coil package is characterized by comprising a cone/pyramid-shaped coil having a conical or pyramidal shape formed by a conductor wire wound around an outer peripheral surface of a core in a manner such that a winding diameter of the coil progressively decreases from one end to the other end of the coil, and a dielectric substrate, wherein the cone/pyramid-shaped coil and the dielectric substrate are integrated with each other by forming a hole in the dielectric substrate, for inserting a tip portion of the cone/pyramid-shaped coil, making a bottom of the hole and a back surface of the dielectric substrate electrically continuous by a via, placing the cone/pyramid-shaped coil in the hole by directing a small-diameter side of the cone/pyramid-shaped coil toward the hole, electrically connecting the bottom of the hole and a tip-side lead wire extending from the cone/pyramid-shaped coil to each other, and connecting an electrode on a large-diameter side of the cone/pyramid-shaped coil to an electrode on the dielectric substrate.

To attain the other object, there is provided a bias tee package for supplying a high-frequency signal by superposing a DC component thereon. The bias tee package is characterized by comprising a cone/pyramid-shaped coil having a conical or pyramidal shape formed by a conductor wire wound around an outer peripheral surface of a core in a manner such that a winding diameter of the coil progressively decreases from one end to the other end of the coil, the cone/pyramid-shaped coil eliminating high-frequency components of the DC component, a capacitor for passing the high-frequency signal there through to eliminate low-frequency components, and a dielectric substrate, wherein the cone/pyramid-shaped coil, the capacitor, and the dielectric substrate are integrated with each other, by forming a hole in the dielectric substrate, for inserting a tip portion of the cone/pyramid-shaped coil, making a bottom of the hole and a back surface of the dielectric substrate electrically continuous by a first via, placing the cone/pyramid-shaped coil in the hole by directing a small-diameter side of the cone/pyramid-shaped coil toward the hole, electrically connecting the bottom of the hole and a tip-side lead wire extending from the cone/pyramid-shaped coil to each other, connecting an electrode on a large-diameter side of the cone/pyramid-shaped coil to an electrode on the dielectric substrate, cutting the dielectric substrate to form a cutout and disposing the capacitor in the cutout, and making opposite ends of the capacitor and the back surface of the dielectric substrate electrically continuous by a second via to thereby cause the tip-side lead wire and one end of the capacitor to be connected to each other.

The above and other objects, features and advantages of the present invention will become apparent from the following description when taken in conjunction with the accompanying drawings which illustrate preferred embodiments of the present invention by way of example.

DESCRIPTION OF THE PREFERRED EMBODIMENTS

Figure 1:
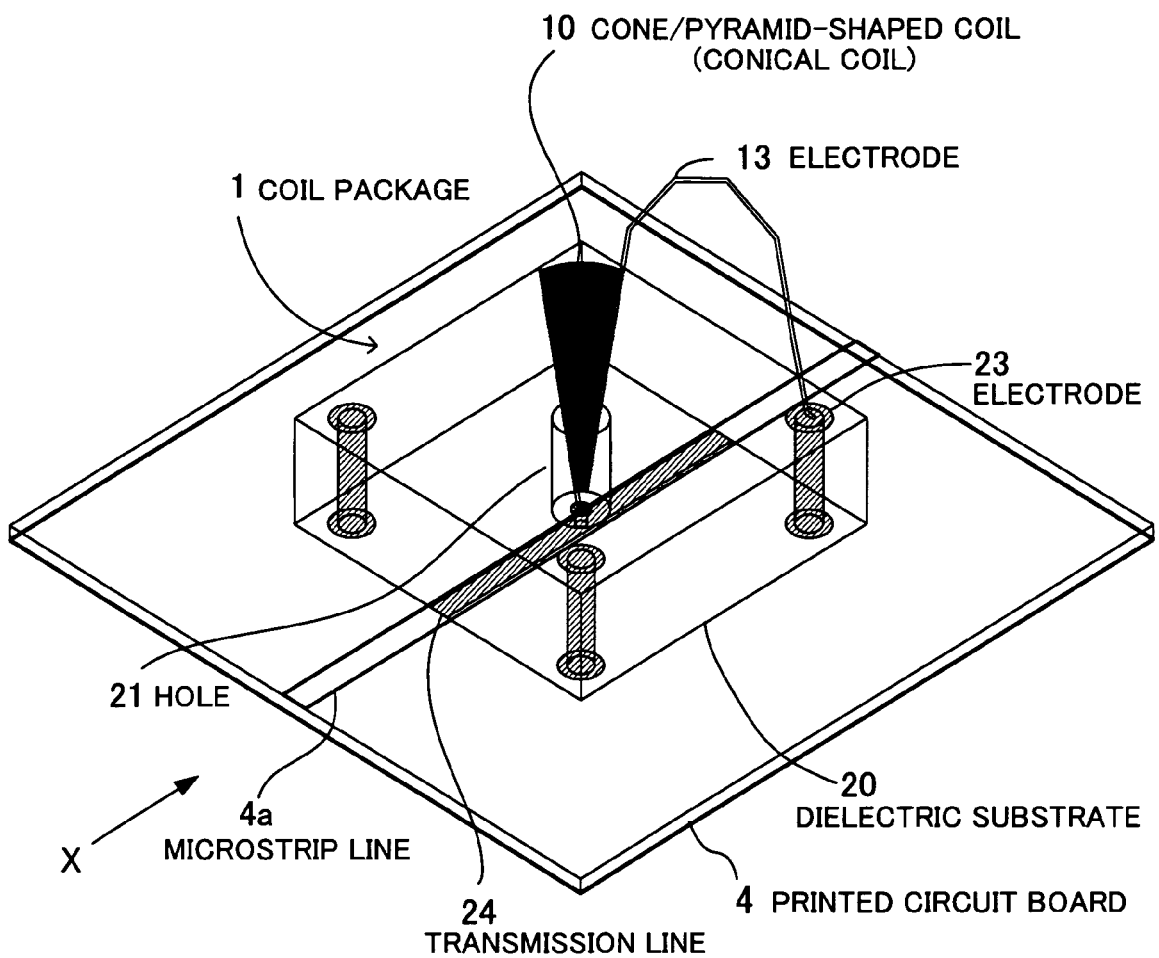
FIG. 1 is a schematic perspective view of a coil package according to a first embodiment of the present invention.
Figure 2:
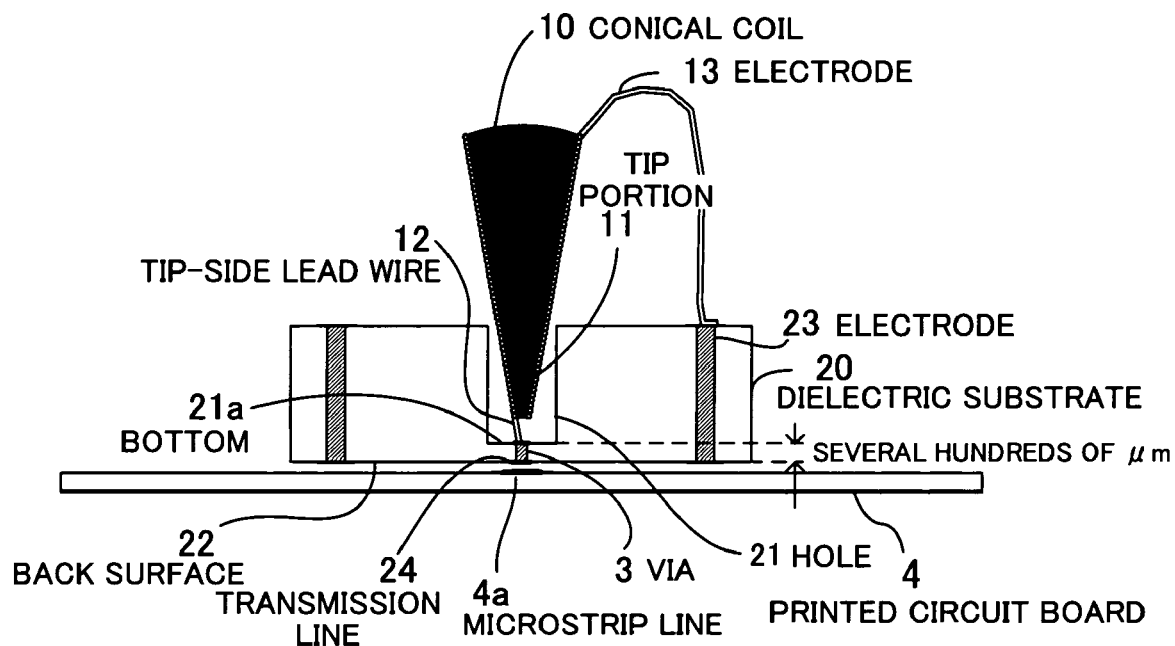
FIG. 2 is a schematic side view of the coil package.
Figure 18:
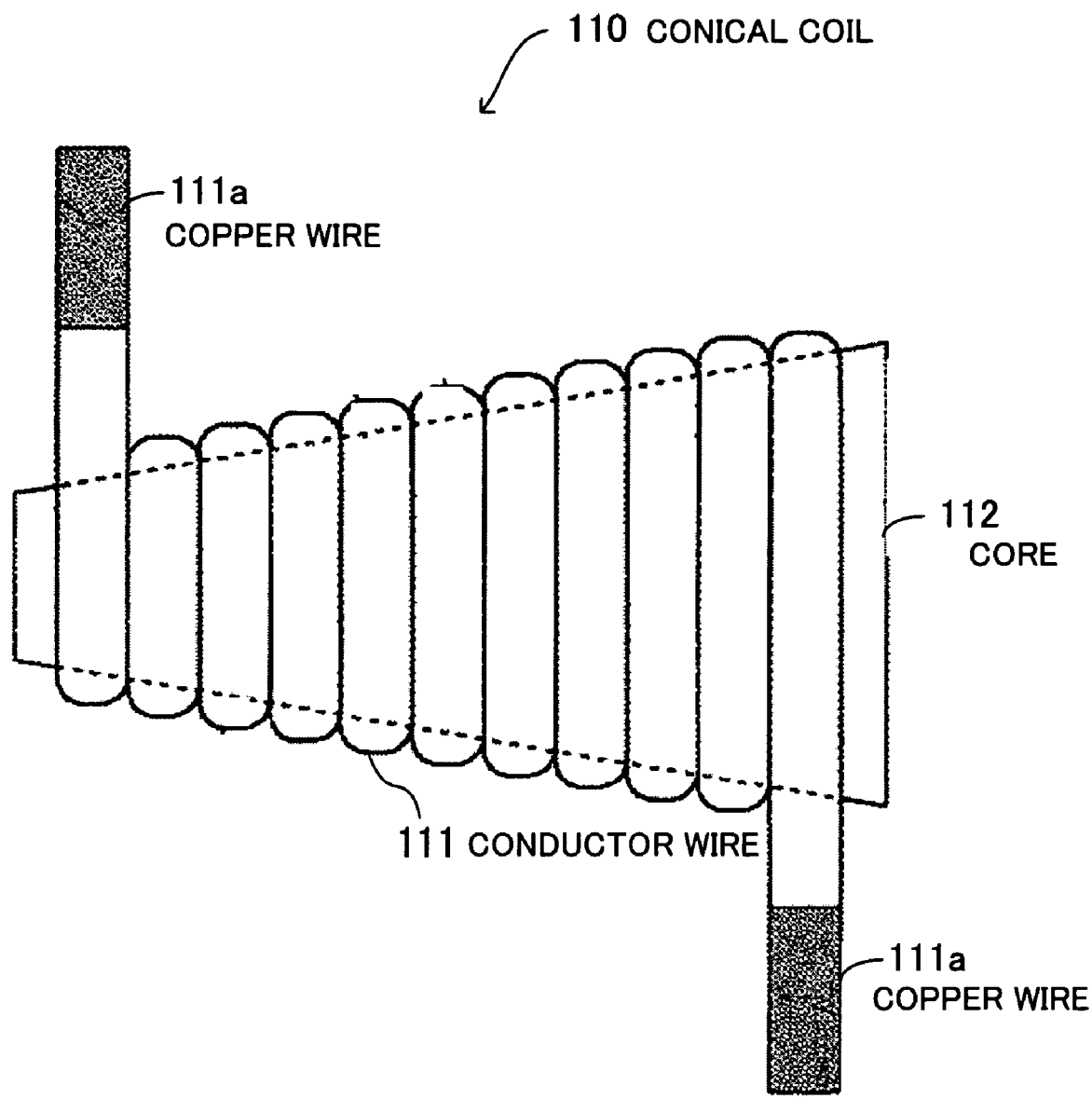
FIG. 18 is a diagram showing the outline of a conical coil.
Figure 19:
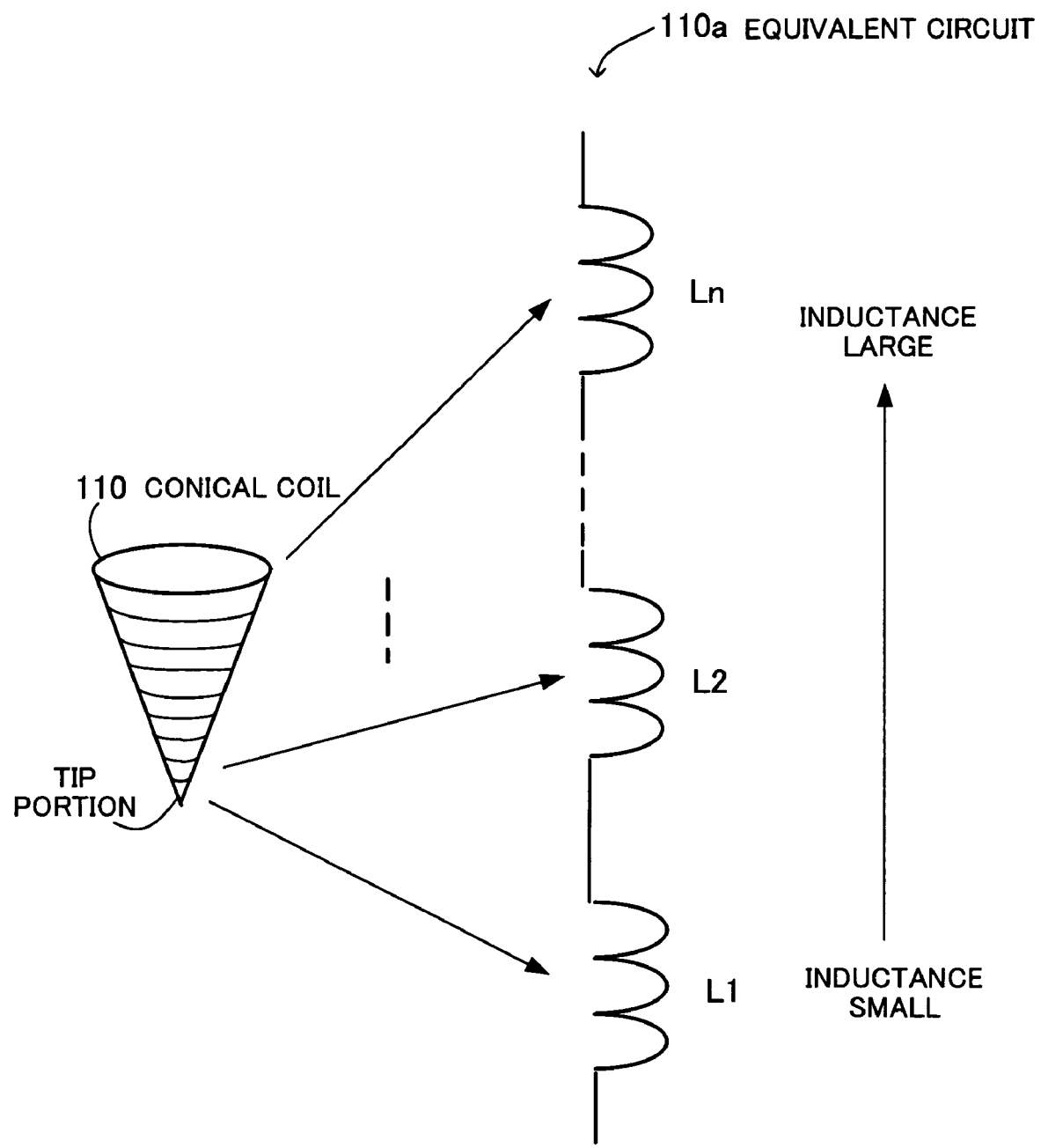
FIG. 19 is a diagram showing an equivalent circuit of the conical coil.
Figure 20:
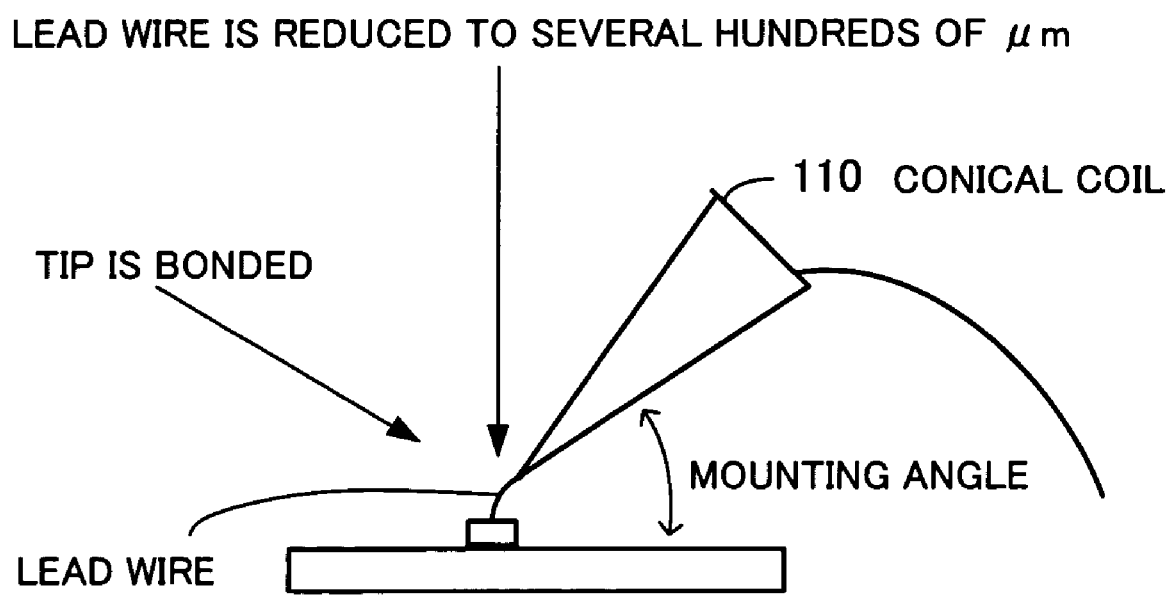
FIG. 20 is a diagram showing a manner of bonding the conical coil.

The present invention will now be described in detail with reference to the accompanying drawings showing preferred embodiments thereof. FIGS. 1 and 2 are a schematic perspective view and a schematic side view of a coil package according to a first embodiment of the present invention, in which FIG. 2 shows the coil package as viewed from the X direction in FIG. 1. The coil package 1 according to the first embodiment is comprised of a dielectric substrate 20, and a cone/pyramid-shaped coil 10. The cone/pyramid-shaped coil 10 is a coil having a conical or pyramidal shape formed by a conductor wire wound around an outer peripheral surface of a core in a manner such that the winding diameter of the conductor wire progressively decreases from one end to the other end of the coil, as described hereinbefore with reference to FIG. 18. Hereinafter, the cone/pyramid-shaped coil 10 is referred to as "the conical coil 10".

As shown in FIGS. 1 and 2, the dielectric substrate 20 made of a ceramic material or a resin is cut to form a hole 21 therein which has a diameter suitable for holding the conical coil 10 at a desired angle when the conical coil 10 is vertically placed therein, and is bottomed by a remaining portion of the dielectric substrate 20, which has a thickness of approximately several hundreds of μm.

A bottom 21a of the hole 21 and a back surface 22 of the dielectric substrate 20 are made electrically continuous by a via (plated hole connecting between layers of a multi-layered printed circuit board) 3 having a length of approximately several hundreds of μm. The via 3 on the back surface side of the dielectric substrate 20 is connected to a transmission line 24 having a narrow width, formed on the back surface 22 of the dielectric substrate 20 (the transmission line 24 is formed by a thin wire so as not to adversely affect a microstrip line 4a on a printed circuit board 4, which is of a type having a characteristic impedance of 50Ω system).

The dielectric substrate 20 machined as above is used as a package substrate, and the conical coil 10 is placed in the hole 21 by inserting the same with the small-diameter side thereof directed toward the hole 21 (the mounting angle of the conical coil 10 is set to approximately 90°), and a tip-side lead wire 12 extending from the tip of the conical coil 10 is electrically connected to the via 3 e.g. by soldering or by an Ag epoxy adhesive. When the conical coil 10 is desired to be positively fixed to the dielectric substrate 20, the conical coil 10 may be fixed to the top of the dielectric substrate 20 by an adhesive.

Furthermore, an electrode 13 (large diameter-side lead wire of the conical coil 10) is connected to an electrode 23 of the dielectric substrate 20 e.g. by soldering or by an Ag epoxy adhesive, or by bonding them to each other through thermal pressing, whereby the conical coil 10 and the dielectric substrate 20 are integrated with each other to form the coil package 1.

It should be noted that although in FIGS. 1 and 2, the coil package 1 is configured such that the large diameter-side electrode 13 of the conical coil 10 is connected to the top of the electrode 23 (formed as a through-hole via) extending between the front and back surfaces of the dielectric substrate 20, the side surface of the dielectric substrate 20 may be metallized to form a metallized portion as the electrode 23, and the electrode 13 may be connected to the metallized side surface i.e. the metallized portion of the dielectric substrate 20.

The coil package 1 formed as above is directly connected to the microstrip line 4a on the printed circuit board 4 (the coil package 1 is formed as a leadless package by being configured as above, which means that lead wires can be dispensed with when the coil package 1 and the printed circuit board 4 are connected to each other).

With the above-described configuration, it is possible to handle the conical coil 10 with ease, shorten the length of wiring of the tip-side lead wire 12 of the conical coil 10 to approximately several hundreds of μm, and hold the mounting angle of the conical coil 10 fixed (at 90°), whereby it is possible to obtain stable frequency characteristics.

Further, since the coil package 1 itself has a stable shape, it is possible to directly connect the coil package 1 to the microstrip line 4a on the printed circuit board 4, thereby making it possible to eliminate a variation in characteristics caused upon mounting of the coil package 1 on the printed circuit board 4. Furthermore, the transmission line 24 formed on the back surface 22 of the coil package 1 has a narrower width than that of the microstrip line 4a on the printed circuit board 4, and therefore adverse influence thereof on the microstrip line 4a is small. Moreover, insofar as a microstrip line having a width not smaller than that of the microstrip line 4a is provided, it is possible to mount the coil package 1 on the microstrip line having a different width. Further, although not shown, a cover may be provided on the top of the coil package 1 such that it covers the entire conical coil 10.

Figure 3:
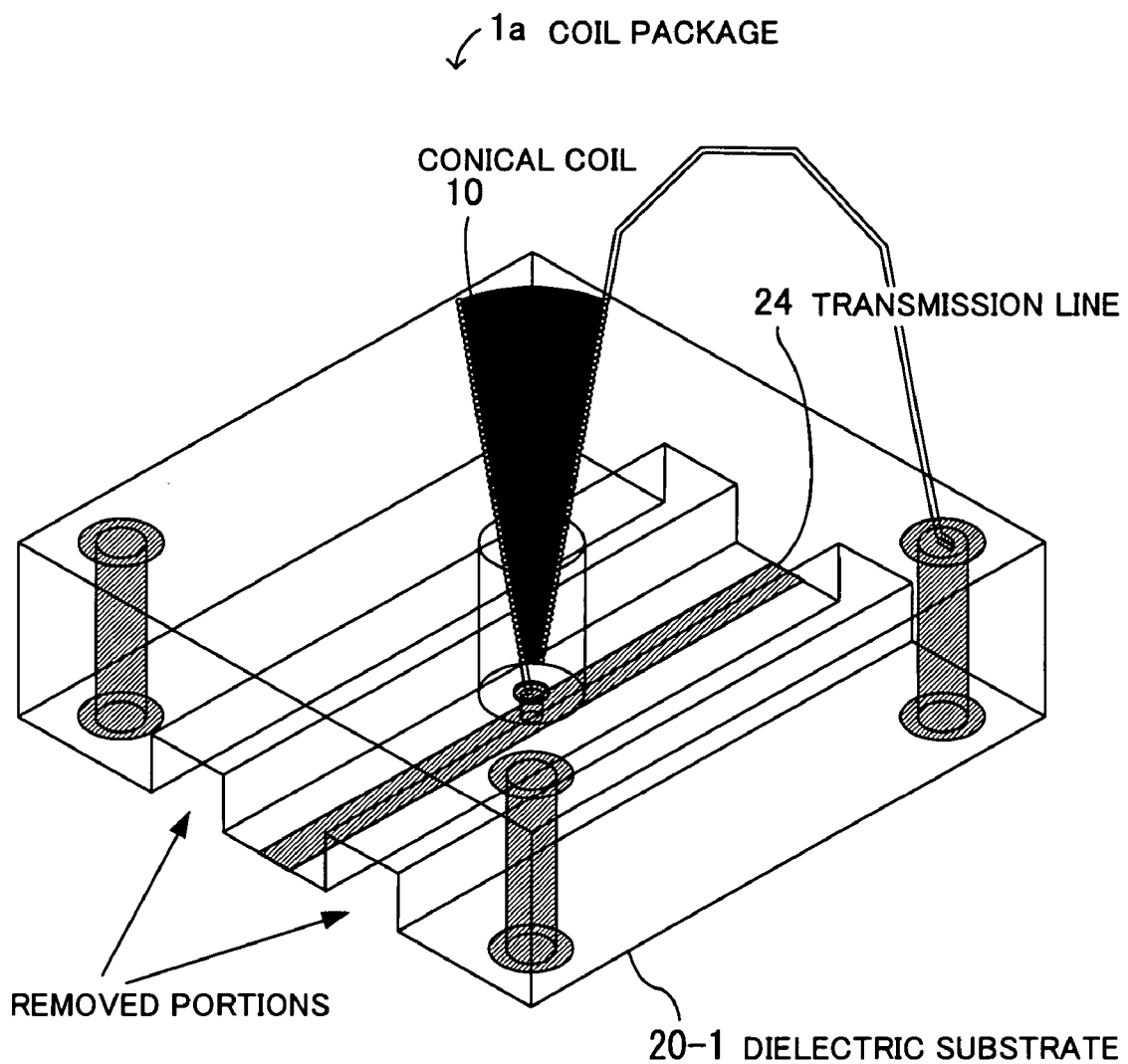
FIG. 3 is a schematic perspective view of a variation of the coil package.
Figure 4:
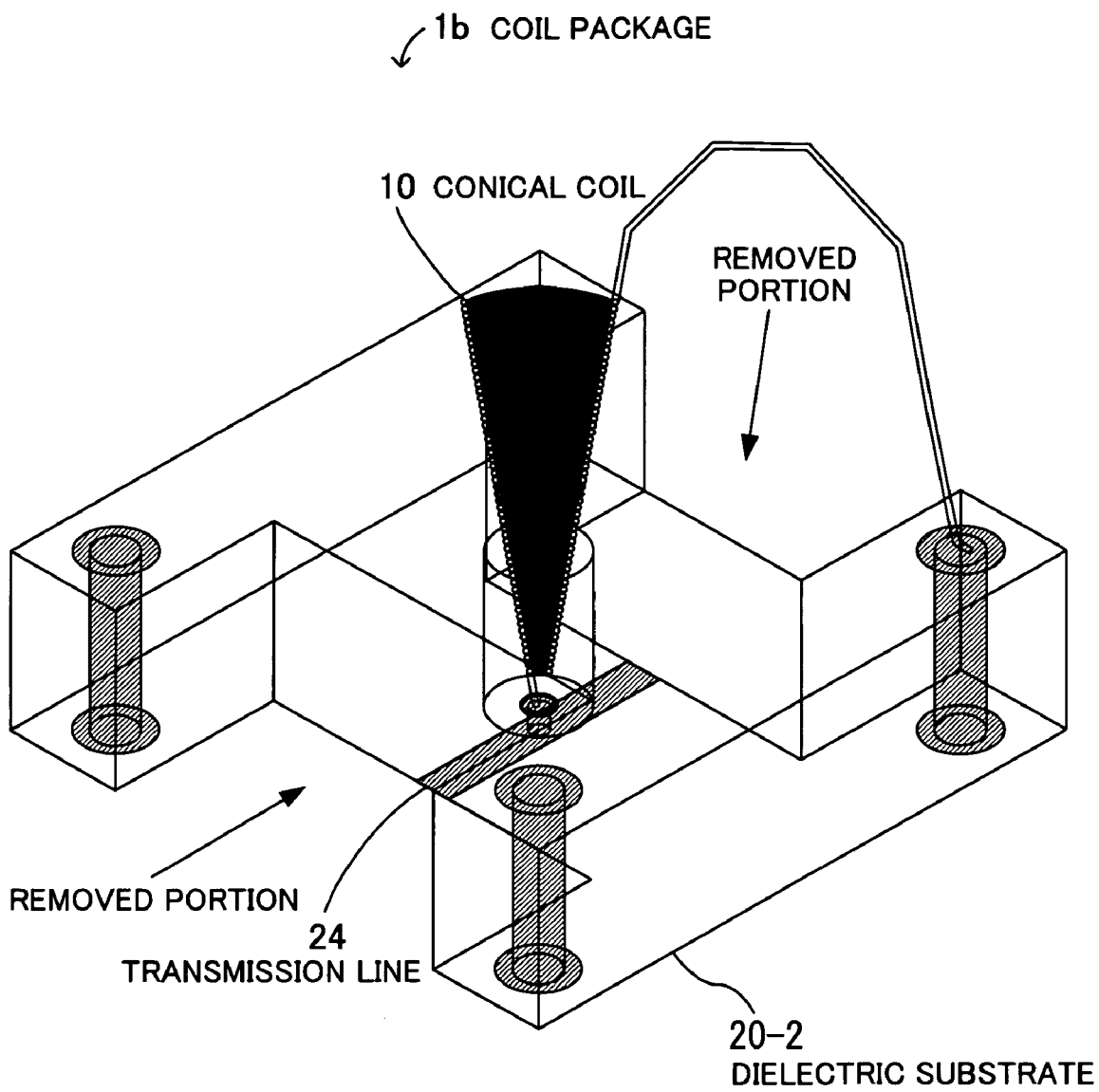
FIG. 4 is a schematic perspective view of another variation of the coil package.

Next, a description will be given of variations of the coil package 1. FIGS. 3 and 4 are schematic perspective views of variations of the coil package 1. Coil packages 1a and 1b shown in FIGS. 3 and 4 are constructed by removing portions from the dielectric substrate 20.

Now, as shown in FIGS. 1 and 2, when the coil package 1 is mounted on the printed circuit board 4, if the dielectric substrate 20 of the coil package 1 exists in the vicinity of a high-frequency transmission line, such as the microstrip line 4a on the printed circuit board 4, there can be caused deviation or reflection of impedance.

Therefore, in the above variations, so as to reduce changes in the dielectric constant occurring with the microstrip line 4a, the coil packages 1a and 1b are constructed by removing dielectric portions from the dielectric substrate 20 in the vicinity of the transmission line 24 (such that the amount of dielectric material is reduced in the vicinity of the microstrip line 4a which is of a type having a characteristic impedance of 50Ω).

Methods of removing portions from the dielectric substrate 20 include a method of removing at least one of dielectric portions of the dielectric substrate 20 on the opposite sides of the transmission line 24, in parallel with the transmission line 24, and a method of removing at least one of the input portion and the output portion of the transmission line 24.

For example, the FIG. 3 coil package 1a is constructed by using a dielectric substrate 20-1 in which dielectric portions of the dielectric substrate 20 in the vicinity of the transmission line 24 on both sides thereof are removed in parallel with the transmission line 24, whereas the FIG. 4 coil package 1b is constructed by using a dielectric substrate 20-2 in which both the input portion and the output portion of the transmission line 24 are removed.

It should be noted that when the dielectric constant of a dielectric substrate is high (when a ceramic-based or plastic-based dielectric substrate is used), it is effective to remove dielectric material from the dielectric substrate along the transmission line 24, as in the FIG. 3 coil package 1a. On the other hand, when the dielectric constant of a dielectric substrate is low, and sufficient frequency characteristics can be obtained by shortening the transmission line 24, it is effective to remove the dielectric material of the input portion and the output portion of the transmission line 24, as in the FIG. 4 coil package 1b.

As described above, by removing portions from a dielectric substrate, it is possible to reduce adverse influence of the dielectric substrate on the microstrip line on the printed circuit board, thereby making it possible to enhance high frequency characteristics of the printed circuit board.

Figure 5:
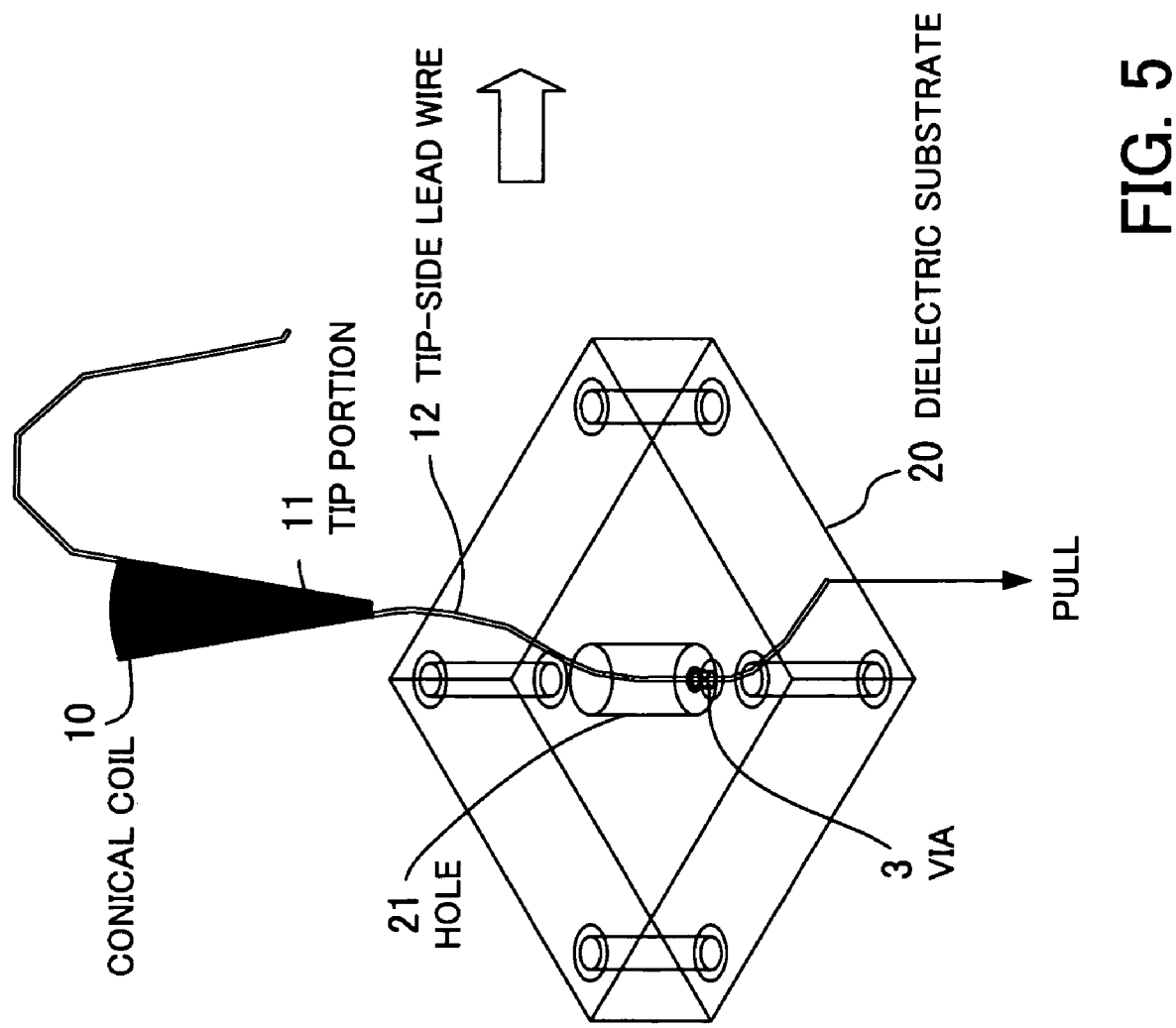
FIG. 5 is a diagram showing a method of mounting a conical coil on a dielectric substrate.
Figure 6:
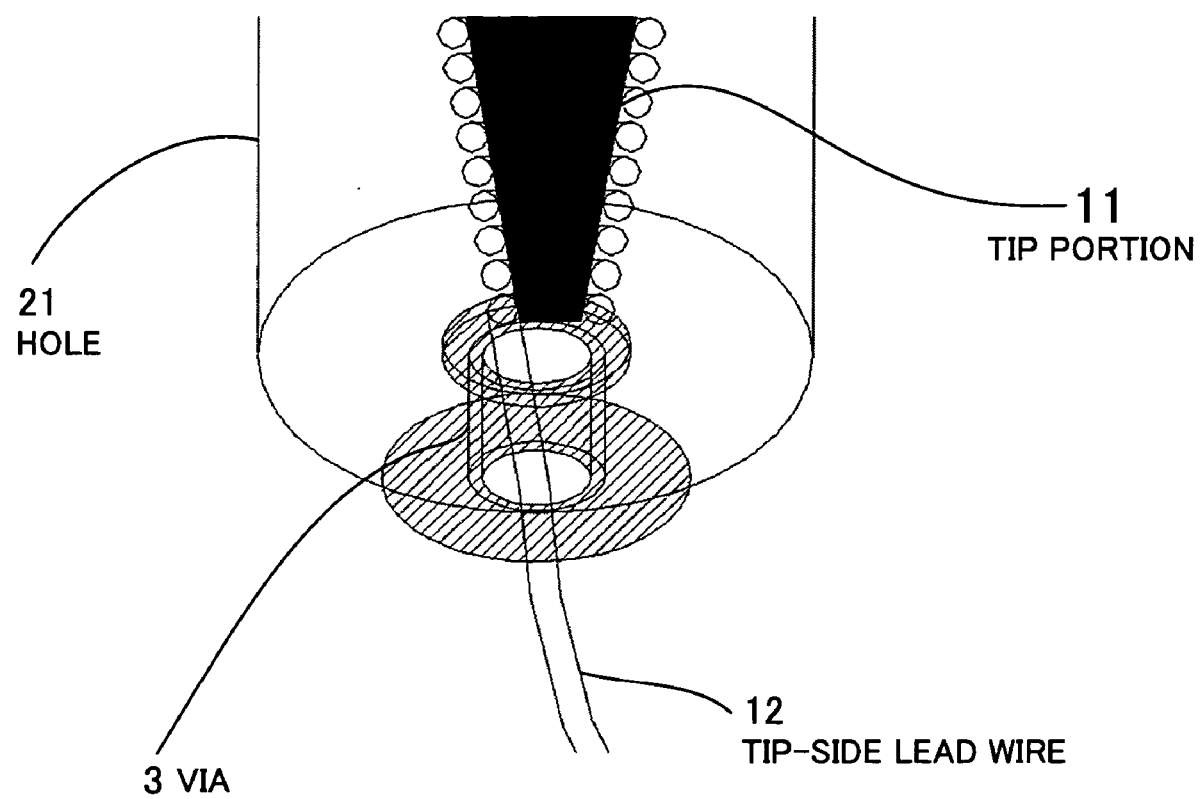
FIG. 6 is an expanded fragmentary schematic view of a tip of the conical coil and components associated therewith.

Next, a description will be given of a method of mounting the conical coil 10 in the dielectric substrate 20. FIG. 5 is a diagram showing the method of mounting the conical coil 10 in the dielectric substrate 20, and FIG. 6 is an expanded fragmentary schematic view of the tip portion 11 of the conical coil 10 and components associated therewith.

The via 3 to which is connected the tip-side lead wire 12 from the tip portion 11 of the conical coil 10 is formed as a through-hole (unfilled via). The wire from the tip portion 11 of the conical coil 10 is put into the though hole and is pulled from the opposite side of the through-hole such that the conical coil 10 is inserted into the hole 21 of the dielectric substrate 20. After that, the tip-side lead wire 12 is electrically connected to the via 3 e.g. by soldering from the back side of the dielectric substrate 20, and an extra length of the lead wire 12 is cut off.

The above-described method makes it possible to easily position the conical coil 10 at the central portion of the hole 21 of the dielectric substrate 20. Further, since the length of the wiring of the tip-side lead wire 12 can be minimized, it is also possible to enhance the high frequency characteristics. Moreover, since the connection of the tip of the conical coil 10 to the via 3 can be performed on the back of the coil package, workability as well can be improved.

Figure 7:
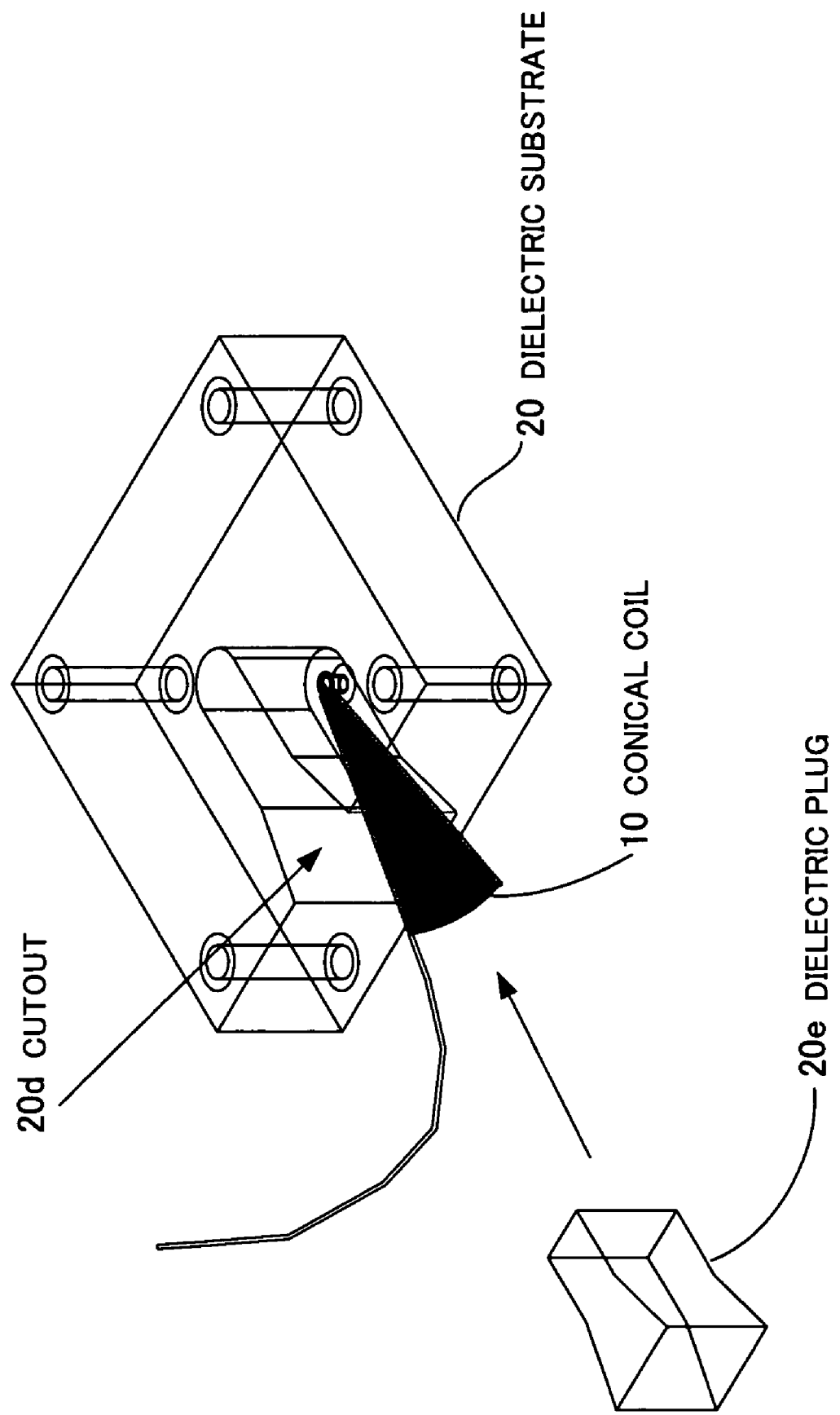
FIG. 7 is a diagram showing another method of mounting the conical coil on the dielectric substrate.

FIG. 7 is a diagram showing another method of mounting the conical coil 10 in the dielectric substrate 20. A cutout 20d is formed in the dielectric substrate 20, and the conical coil 10 is inserted into the cutout 20d in a state tilted to a horizontal position with the small-diameter side thereof directed toward the cutout 20d. Then, the tip-side lead wire 12 is connected to the bottom of the hole 21 by soldering or bonding. Thereafter, the conical coil 10 is raised upright, and in this state, fixed to the dielectric substrate 20 e.g. by an adhesive.

It should be noted that as shown in FIG. 7, a dielectric plug 20e for the dielectric substrate 20 may be inserted into the cutout 20d for fixing the conical coil 10 raised upright. Alternatively, a projection for filling the cutout 20d may be formed on the cover for covering the conical coil 10, and the conical coil 10 may be held by the projection.

The above-described method makes it possible to easily connect the tip of the conical coil 10 to the via 3. Further, by forming the cutout 20d to fit the conical coil 10, it is also possible to cause the tip of the conical coil 10 to be aligned with the via 3, for connection.

Figure 8A:
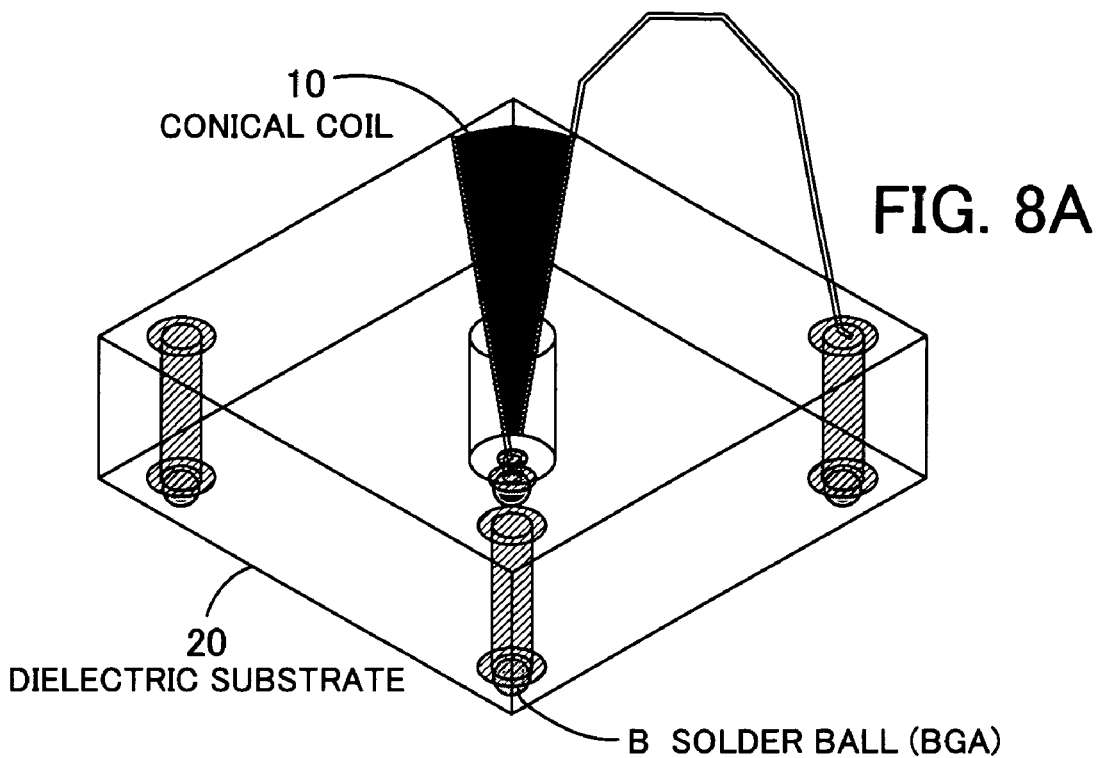
FIGS. 8A and 8B are diagrams showing an example of a method of connecting between the coil package and a printed circuit board.
Figure 8B:
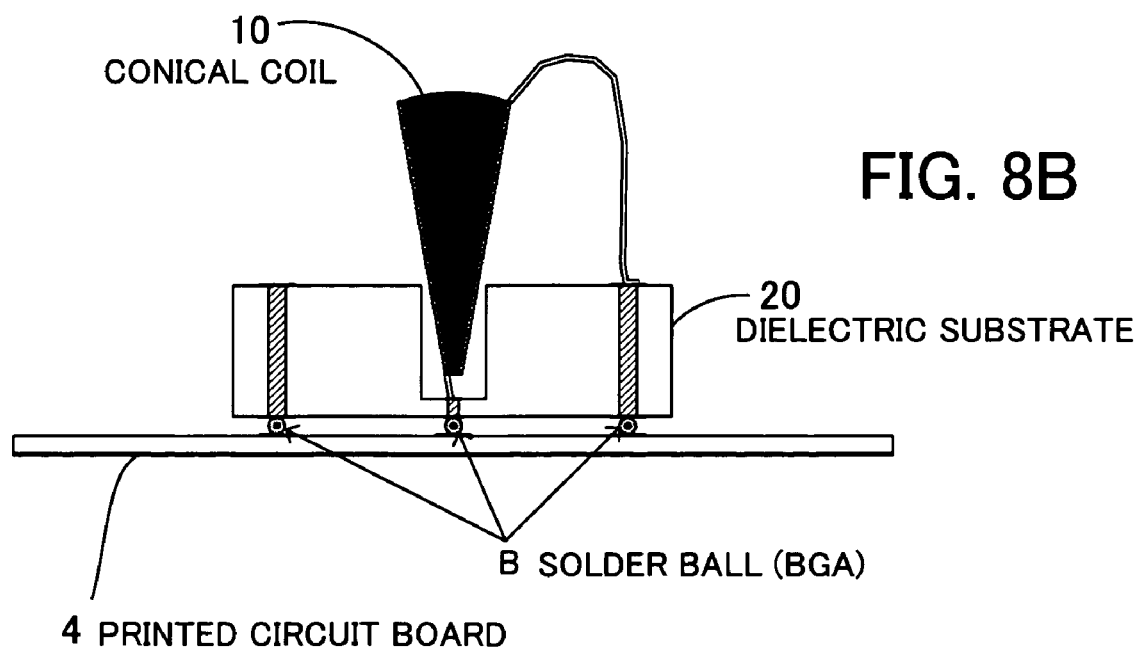

Next, a description will be given of a method of connecting between the coil package 1 and the printed circuit board 4. FIGS. 8A and 8B are diagrams showing an example of the method of connecting between the coil package 1 and the printed circuit board 4. As shown in these figures, solder balls B (of BGA: Ball Grid Array) are attached to connecting portions of the coil package 1, which are to be connected to associated portions of the printed circuit board 4, and the coil package 1 is connected to the printed circuit board 4 via the solder balls B (in an IC which is highly integrated and necessitates multiple-pin connection, a package is widely used which has ball-shaped solders called BGA formed on the IC side in advance).

As described above, by using the BGA in the coil package 1, the coil package 1 can be mounted on the printed circuit board 4 with ease. Further, by using the BGA, it is possible to avoid the package from being brought into contact with a transmission line on the printed circuit board 4, thereby making it possible to reduce the adverse influence of the package on the transmission line on the printed circuit board 4.

Furthermore, when the FIG. 5 method of mounting the conical coil 10 is employed, by attaching a BGA to a portion of the back surface of the coil package 1, to which the tip of the conical coil 10 is connected by soldering, it is possible to accommodate variation in the surface of the coil package 1 in the direction of height thereof.

Next, other embodiments of the coil package 1 will be described. As shown in FIGS. 1 and 2, the process (manufacturing process) for forming the hole 21 in a unitary dielectric substrate 20 and making the front and back surfaces of the dielectric substrate 20 electrically continuous by the via 3 formed in the bottom of the hole 21 can be carried out easily when the dielectric substrate 20 is a ceramic-based or plastic-based dielectric substrate having a high dielectric constant. However, it is sometimes difficult to carry out the process on a unitary dielectric substrate having a low dielectric constant, especially when the dielectric substrate is made of a LTCC (Low Temperature Co fired Ceramic), an organic resin, or a like material.

Therefore, when a coil package is formed by using such a dielectric substrate with a low dielectric constant, a method is employed in which the dielectric substrate is divided into two layers, and the two layers are connected to each other after necessary processes are carried out on the divisional dielectric substrates of the respective layers.

Figure 9:
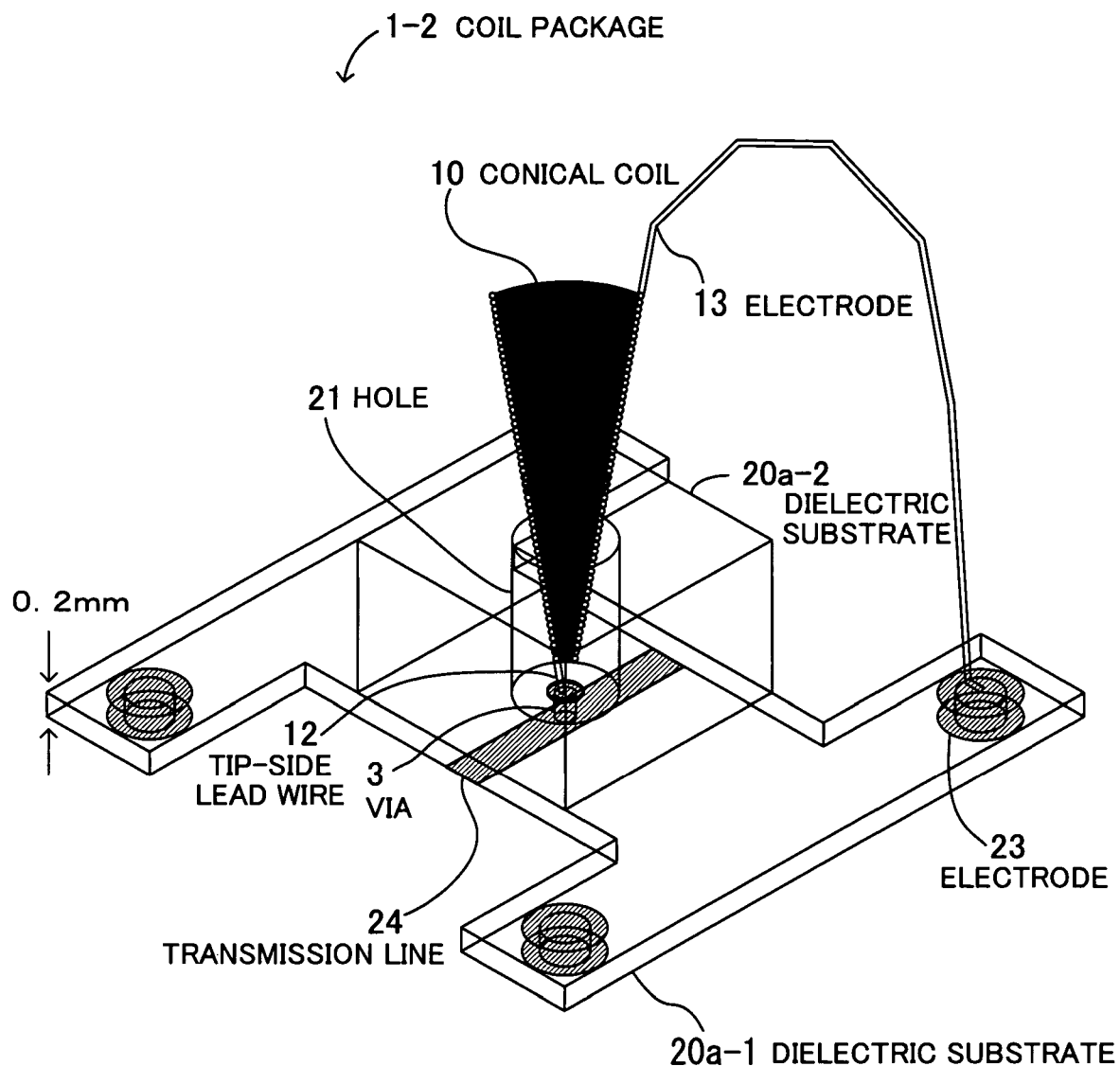
FIG. 9 is a schematic perspective view of a coil package according to a second embodiment of the present invention.

FIG. 9 is a schematic perspective view of a coil package according to a second embodiment of the present invention. The coil package 1-2 according to the second embodiment is comprised of a conical coil 10, a dielectric substrate 20a-1 (first dielectric substrate), and a dielectric substrate 20a-2 (second dielectric substrate).

The dielectric substrate 20a-1, which is a thin substrate with a thickness of approximately 0.2 mm, is connected to a printed circuit board 4, not shown in FIG. 9, and the dielectric substrate 20a-2, which has the conical coil 10 mounted thereon, is mounted on the dielectric substrate 20a-1.

Here, a via 3 is formed in the dielectric substrate 20a-1, for making the front and back surfaces of the dielectric substrate 20a-1 electrically continuous. Further, a hole 21 for inserting the tip portion of the conical coil 10 is formed in the dielectric substrate 20a-2, and the conical coil 10 is placed in the hole 21 by inserting the same with the small-diameter side thereof directed toward the hole 21.

Then, the bottom of the hole 21 and a tip-side lead wire 12 of the conical coil 10 are electrically connected to each other, and the bottom of the hole 21 and the via 3 are connected to each other. Further, an electrode 13 on the large-diameter side of the conical coil 10 is connected to an electrode 23 of the dielectric substrate 20a-1, whereby the conical coil 10 and the dielectric substrates 20a-1 and 20a-2 are integrated with each other to form a coil package 1-2.

As described above, by diving the dielectric substrate into two, i.e. upper and lower layers, it is possible to easily form the coil package even when a dielectric substrate with a low dielectric constant, made of an LTCC, an organic resin, or a like material is used. As a result, it is possible to reduce adverse influence of the dielectric substrate on a microstrip line on the printed circuit board, thereby making it possible to enhance the high frequency characteristics of the printed circuit board.

Figure 10:
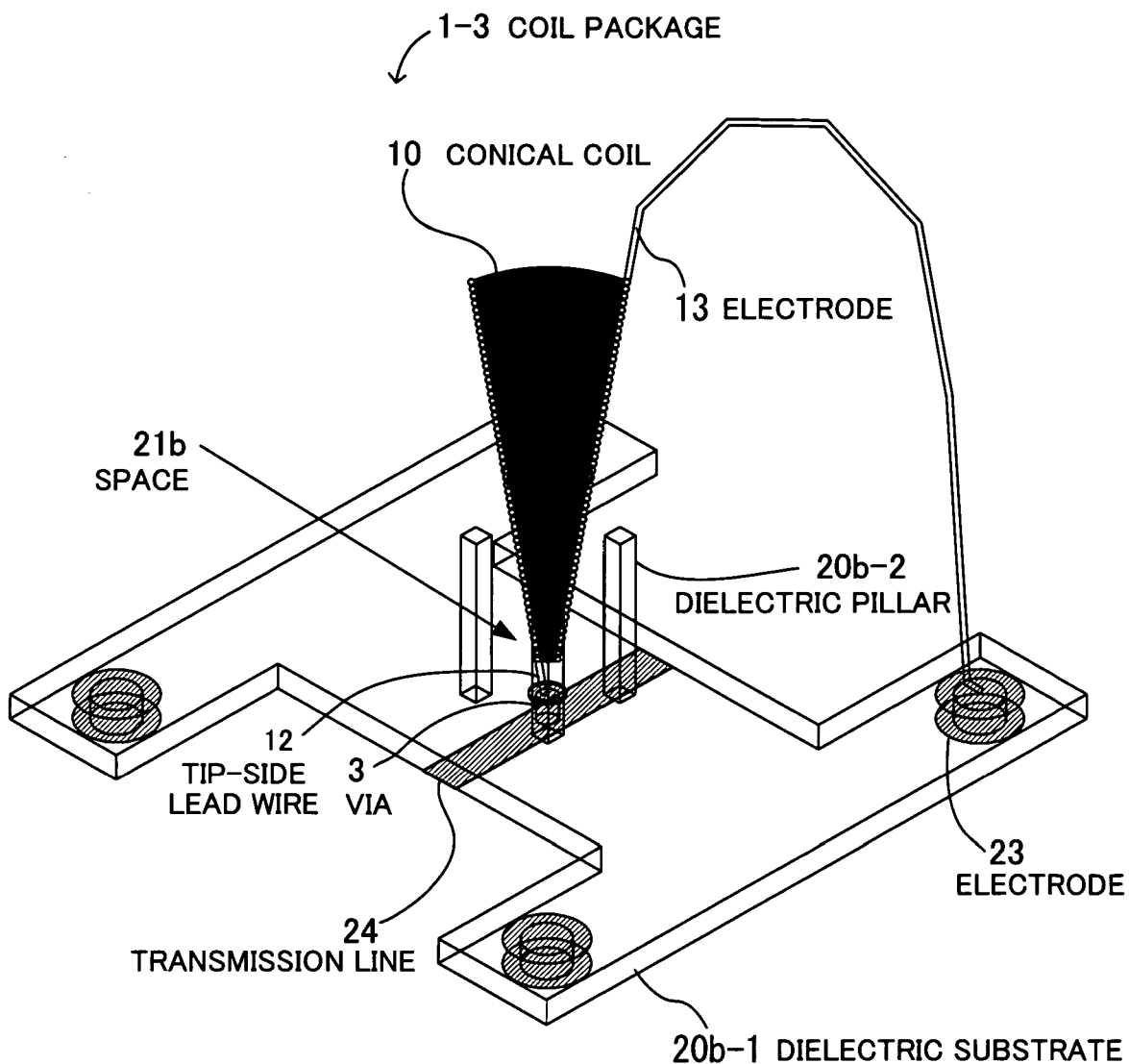
FIG. 10 is a schematic perspective view of a coil package according to a third embodiment of the present invention.

Next, a coil package according to a third embodiment of the present invention will be described. FIG. 10 is a schematic perspective view of the construction of the coil package. The coil package 1-3 according to the third embodiment is comprised of a conical coil 10, a dielectric substrate 20b-1, and dielectric pillars 20b-2.

The dielectric substrate 20b-1, which is a thin substrate, is connected to a printed circuit board 4, not shown in FIG. 10. The dielectric pillars 20b-2 are formed by a plurality of thin pillars (four pillars, although one of them is difficult to view in FIG. 10 due to the presence of the conical coil 10) for supporting the conical coil 10, to thereby define a space 21b for inserting the tip portion of the conical coil 10, and the conical coil 10 is mounted on the dielectric substrate 20b-1.

Here, a via 3 is formed in the dielectric substrate 20b-1, for making the front and back surfaces of the dielectric substrate 20b-1 electrically continuous. The conical coil 10 is placed in the space 21b defined by the dielectric pillars 20b-2, by inserting the same with the small-diameter side thereof directed toward the space 21b, and the via 3 and the tip-side lead wire 12 of the conical coil 10 are electrically connected to each other.

Further, an electrode 13 on the large-diameter side of the conical coil 10 is connected to an electrode 23 of the dielectric substrate 20b-1, whereby the conical coil 10, the dielectric substrate 20b-1, and the dielectric pillars 20b-2 are integrated with each other to form a coil package 1-3.

As described hereinabove, the coil package 1-3 is configured such that the conical coil 10 is fixed by the thin dielectric pillars (although in FIG. 10, four dielectric pillars are used, three or two pillars may be used insofar as they are capable of holding the conical coil 10), whereby it is possible to form a wider empty space around the tip portion of the conical coil 10. Therefore, the dielectric constant around the tip portion of the conical coil 10 can be lowered to reduce the capacitance of a coil at the tip portion of the conical coil 10 (portion having the largest influence on high frequency), which makes it possible to enhance the high frequency characteristics of the conical coil 10. Further, if the coil package is configured as above, it is also possible to visually confirm the connection at the tip portion of the conical coil 10.

Figure 11:
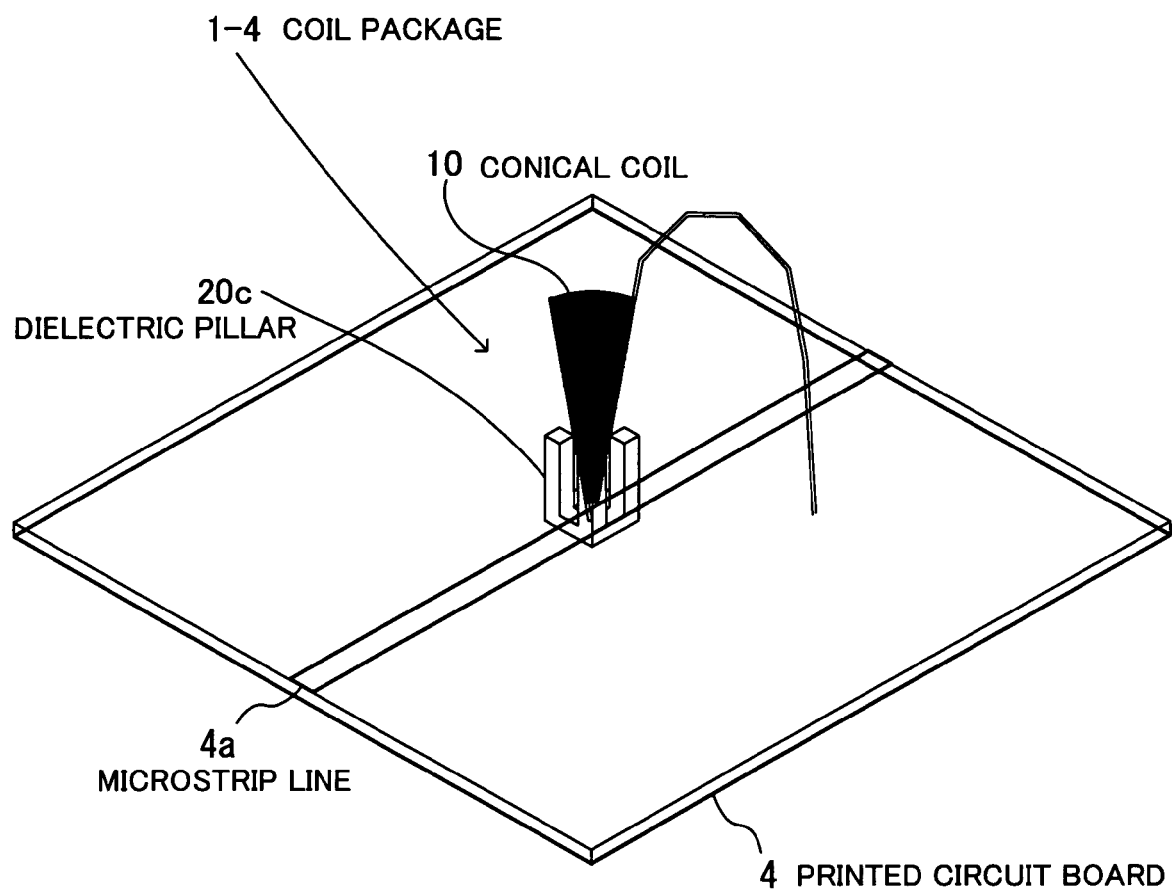
FIG. 11 is a schematic perspective view of a coil package according to a fourth embodiment of the present invention.

Next, a fourth embodiment of the present invention will be described. FIG. 11 is a schematic perspective view of a coil package according to the fourth embodiment. The coil package 1-4 according to the fourth embodiment is comprised of a conical coil 10, and dielectric pillars 20c. The dielectric pillars 20c are formed by a plurality of (four in FIG. 11) thin pillars which define a space for inserting the tip portion of the conical coil 10 to thereby support the conical coil 10.

The conical coil 10 is inserted into the space defined by the dielectric pillars 20c, and is fixed e.g. by an adhesive in a manner such that the tip portion of the conical coil 10 does not protrude from between the dielectric pillars 20c. Then, the coil package 1-4 having the conical coil 10 and the dielectric pillars 20c integrated therewith is connected to a printed circuit board 4.

The above-described configuration of the coil package 1-4 makes it possible to easily handle the conical coil, and reduce the length of a lead wire from the tip portion of the conical coil 10 and a parasitic capacitance of the same, which can otherwise be factors of degrading the high frequency characteristics.

Figure 12:
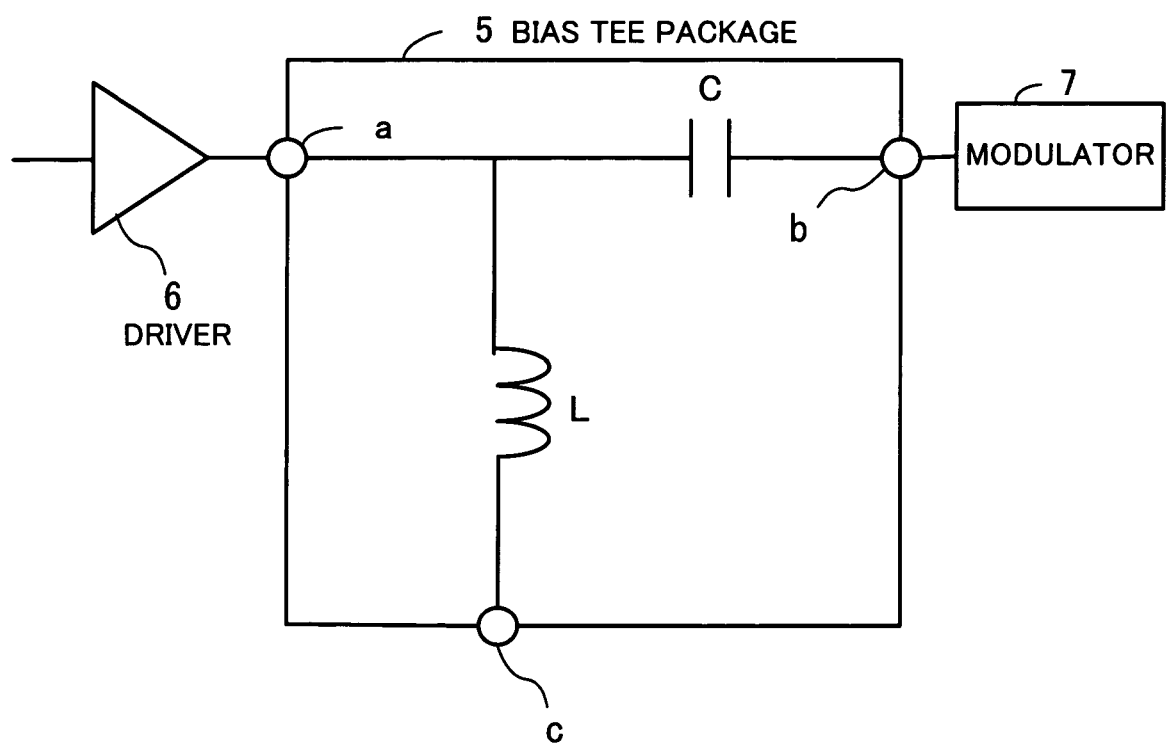
FIG. 12 is a diagram showing a circuit configuration of a bias tee package.

Next, a description will be given of a bias tee package. FIG. 12 is a diagram of the circuit configuration of the bias tee package. The bias tee package 5 is comprised of a capacitor C and a conical coil L, and is constructed by connecting the capacitor C between terminals "a" and "b", and connecting the conical coil L between the terminal "a" and a terminal "c".

More specifically, the terminal "a" is connected to one end of the capacitor C and one end of the conical coil L to each other. The other end of the capacitor C is connected to the terminal "b", and the other end of the conical coil L is connected to the terminal "c".

In the bias tee package 5, a high-frequency signal delivered from a driver 6 is passed between the terminals "a" and "b" for eliminating low-frequency components thereof by the capacitor C. Further, a DC component inputted from the terminal "c" has high-frequency components eliminated by the conical coil L, and are superposed on the high-frequency signal. The resulting high-frequency signal is delivered to a modulator 7.

Figure 13:
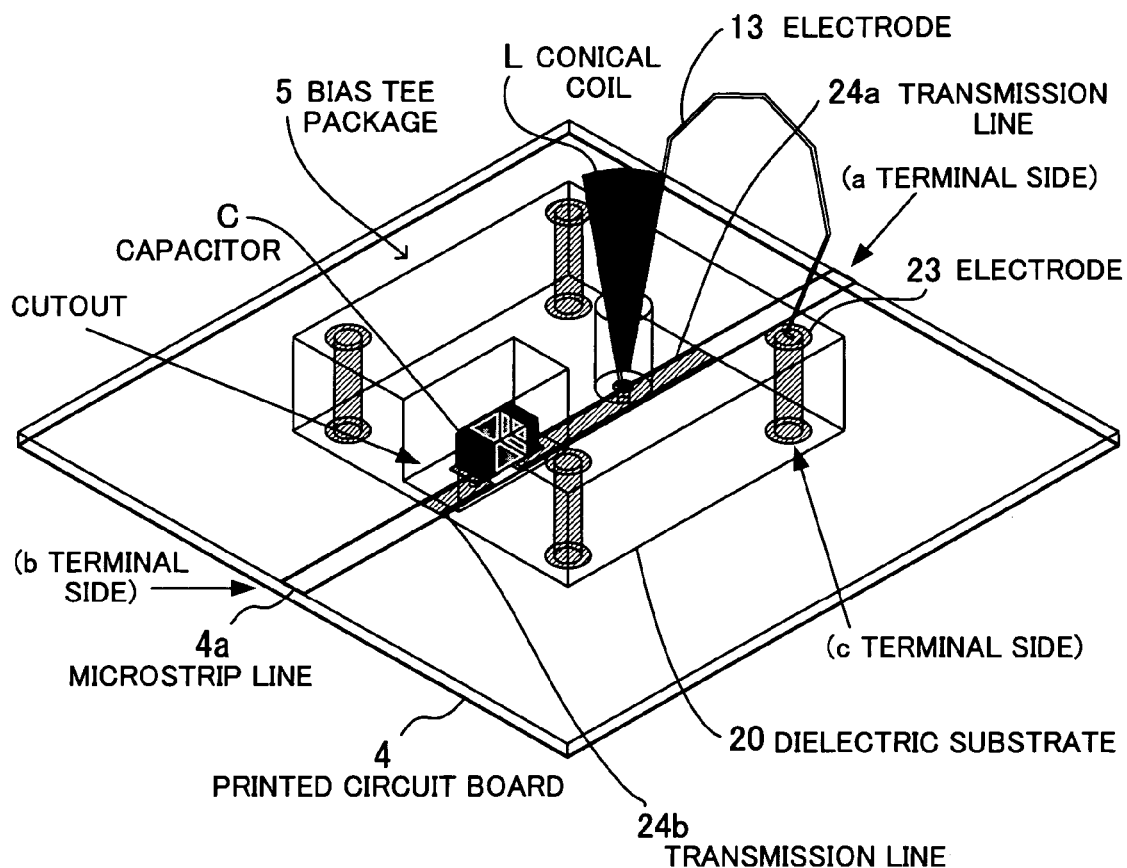
FIG. 13 is a schematic perspective view showing the arrangement of component parts of the bias tee package.

FIG. 13 is a schematic perspective view showing the arrangement of component parts of the bias tee package 5. The bias tee package 5 is configured such that the capacitor c is disposed within the coil package 1. In the bias tee package 5, the dielectric substrate 20 is cut to form a cutout, and the capacitor c is disposed in the cutout. The opposite ends of the capacitor c are connected to transmission lines 24a and 24b provided on the back surface of the dielectric substrate 20, using a via ((second via) different from a via (first via) to which is connected the conical coil L).

Since the transmission line 24a is connected to the tip portion of the conical coil L, the one end of the capacitor c is connected to the tip portion of the conical coil L, and the other end of the capacitor c is connected to the transmission line 24b (the transmission lines 24a and 24b are not in contact with each other but spaced from each other). It should be noted that the mounting structure of the conical coil L is the same as the mounting structure illustrated in FIG. 1. The bias tee package 5 having the capacitor C, the conical coil L, and the dielectric substrate 20 integrated with each other, as described above, is connected to the microstrip line 4a on the printed circuit board 4.

As described hereinabove, the coil package and the bias tee package according to the present invention make it possible to package the conical coil without degrading the characteristics thereof, thereby making it possible to easily handle the conical coil and at the same time enhance the frequency characteristics.

Further, as to reflow, solder paste is applied to portions of the printed circuit board, to which associated portions of the coil package or the bias tee package are to be connected, and the associated portions of the coil package or the bias tee package are placed on the portions of the printed circuit board. Then, the printed circuit board is heated in a reflow furnace to melt the solder for connection.

As described above, it is possible to mount the coil package or the bias tee package on the microstrip line on the printed circuit by reflowing. Therefore, the coil package or the bias tee package can be mounted on the microstrip line on the printed circuit board, simultaneously with other circuit components, such as IC chips and resistances, whereby it is possible to enhance productivity.

Figure 14:
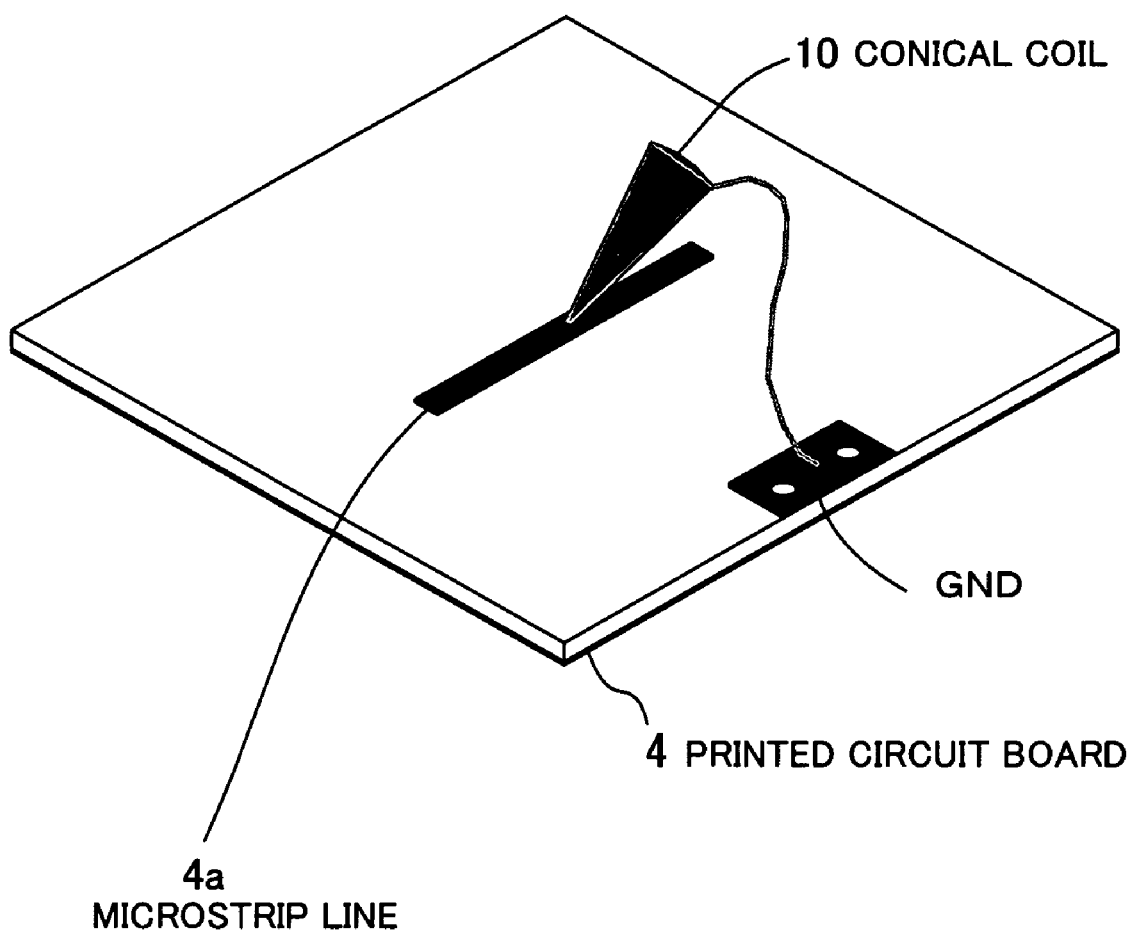
FIG. 14 is a schematic perspective view of a measuring device for the conical coil.

Next, a description will be given of results of evaluation concerning the mounting angle of the conical coil 10 and the frequency characteristics thereof. FIG. 14 is a schematic perspective view of a measuring device for the conical coil 10. The small-diameter side of the conical coil 10 is connected to the microstrip line 4a on the printed circuit board 4, and the large-diameter side of the same is connected to ground GND.

With this arrangement, the frequency characteristics of the conical coil 10 were evaluated in terms of S21 (permeability in the forward direction), which is an S parameter of the microstrip line 4a. Now, the following two points can be given as characteristic-degrading factors.

(1) A longer electrode (tip-side lead wire) on the small-diameter side of the conical coil 10 is provided for connection.

(2) A side surface of the conical coil 10 on the small-diameter side thereof is closer to a surface of the microstrip line 4a (the tip portion of the conical coil 10 is added a parasitic capacitance).

Figure 15:
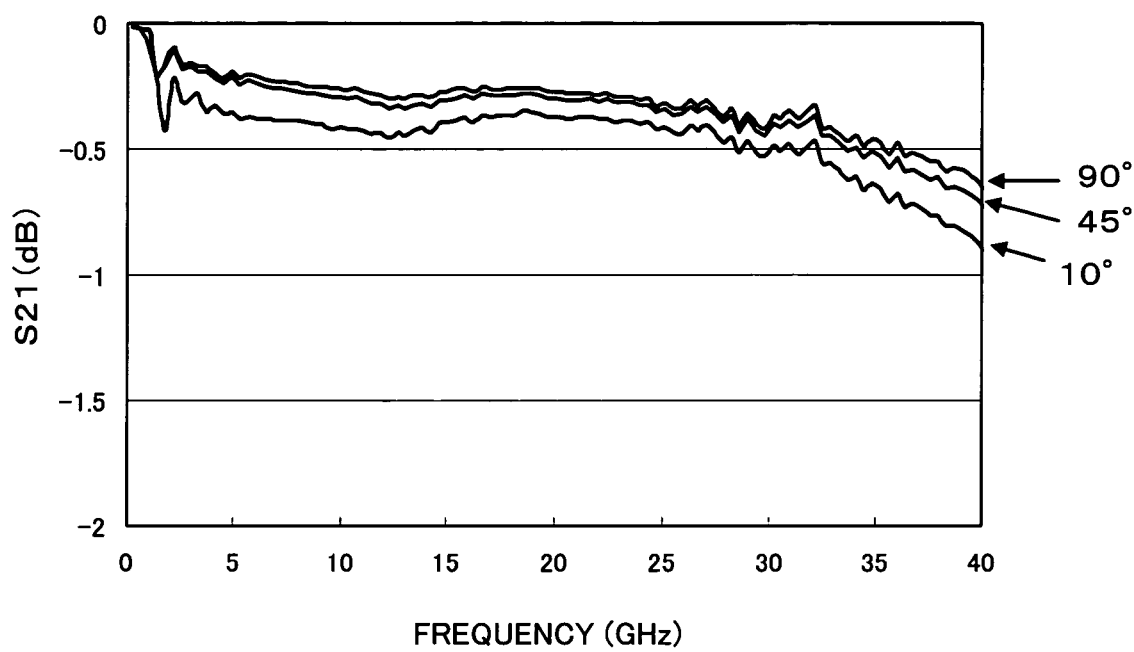
FIG. 15 is a diagram showing results of measurement of frequency characteristics.

In measuring the S21 parameter, the length of the tip portion of the conical coil 10 was set to 0.1 mm, and the mounting angle of the conical coil 10 was varied. FIG. 15 is a diagram showing the results of the measurement of the frequency characteristics of the conical coil 10. In FIG. 15, the vertical axis represents S21(dB), and the horizontal axis represents the frequency (GHz). It is understood from FIG. 15 that the frequency characteristics are most excellent when the mounting angle is 90°, and degraded as the mounting angle is made smaller.

Figure 16:
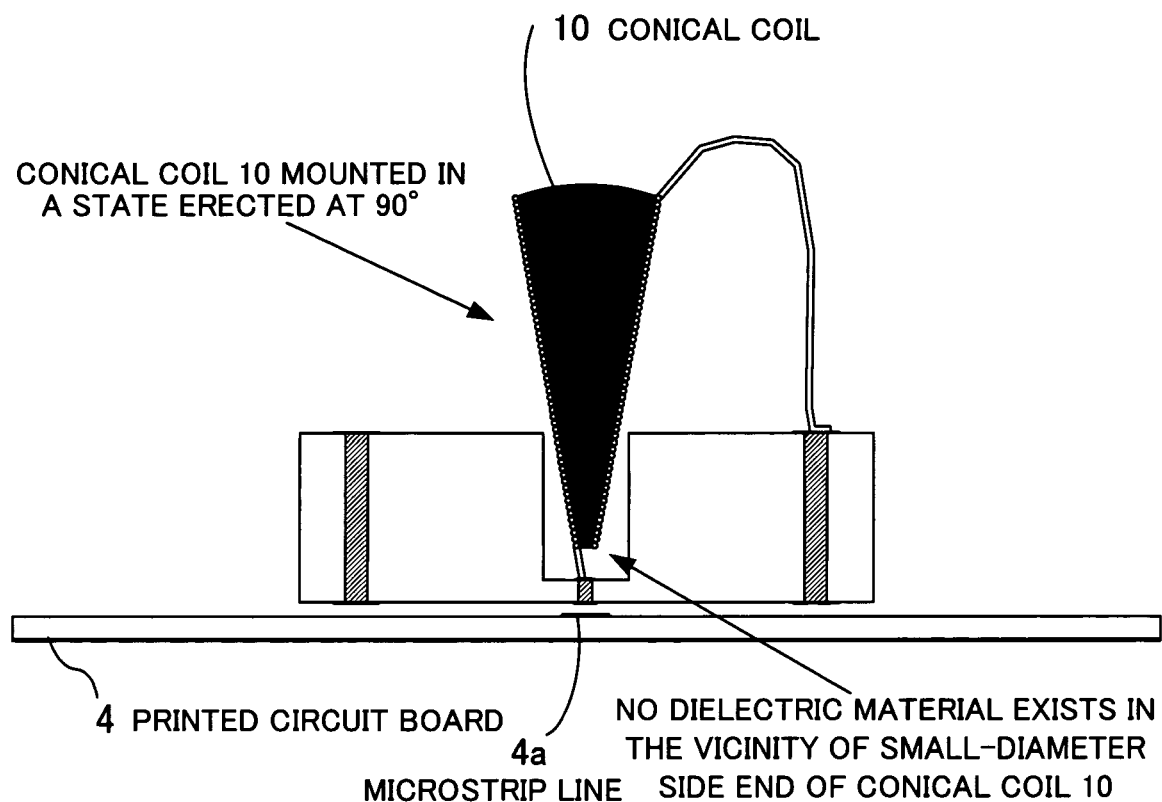
FIG. 16 is a diagram showing an ideal mounted state of the conical coil.
Figure 17:
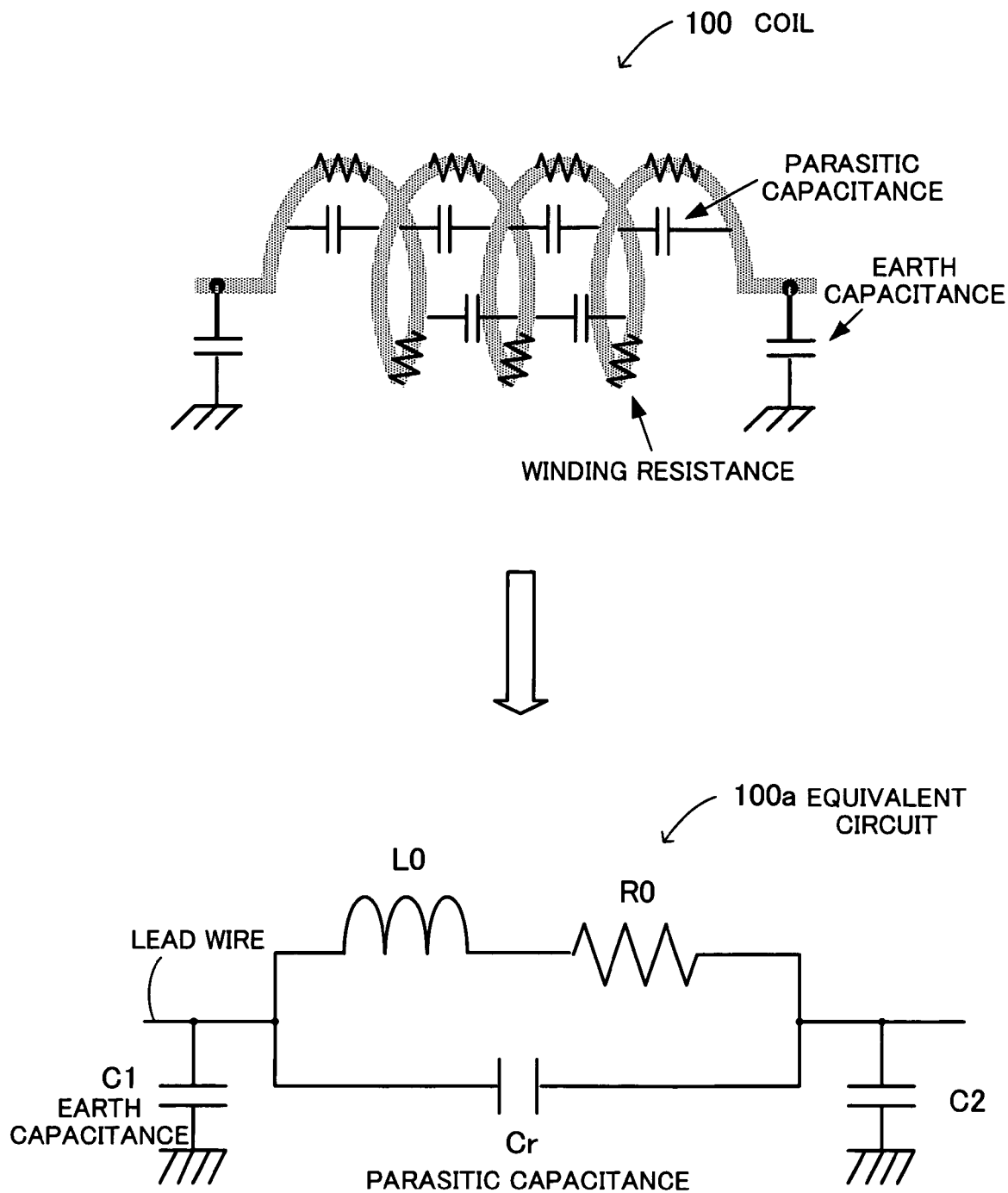
FIG. 17 is a diagram showing an equivalent circuit of a coil.

FIG. 16 is a diagram showing an ideal mounted state of the conical coil 10. As is clear from the results of the evaluation, to obtain the most excellent frequency characteristics, the conical coil 10 is mounted in a manner erected at 90° with respect to the microstrip line 4a on the printed circuit board 4. This makes it possible to mount the conical coil 10 such that no dielectric material exists around the tip portion of the conical coil 10, whereby the ideal mounted state can be realized which makes the frequency characteristics of the conical coil 10 most excellent.

In the coil package and the bias tee package according to the present invention, excellent frequency characteristics can be obtained since they provide the FIG. 16 mounted state of the conical coil 10. Further, due to the packaged structure thereof, they are easy to handle. Further, since reflow is made possible, it is also possible to enhance productivity.

The coil package according to the present invention is configured such that a hole for inserting the tip portion of the cone/pyramid-shaped coil is formed in the dielectric substrate; the bottom of the hole and the back surface of the dielectric substrate are made electrically continuous by a via; the cone/pyramid-shaped coil is disposed in the hole by inserting the same with the small-diameter side thereof directed toward the hole; the bottom of the hole and the tip-side lead wire of the coil are electrically connected to each other; and the electrode on the large-diameter side of the cone/pyramid-shaped coil is connected to the electrode of the dielectric substrate, whereby the cone/pyramid-shaped coil and the dielectric substrate are integrated with each other. This makes it possible to package the cone/pyramid-shaped coil without degrading the characteristics of the cone/pyramid-shaped coil, thereby making it possible to easily handle the cone/pyramid-shaped coil and at the same time enhance the frequency characteristics thereof.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A coil package having a coil mounted therein, comprising:
    a cone/pyramid-shaped coil having a conical or pyramidal shape formed by a conductor wire wound around an outer peripheral surface of a core in a manner such that a winding diameter of said coil progressively decreases from one end to the other end of said coil; and
    a dielectric substrate,
    wherein said cone/pyramid-shaped coil and said dielectric substrate are integrated with each other by forming a hole in said dielectric substrate, for inserting a tip portion of said cone/pyramid-shaped coil, making a bottom of the hole and a back surface of said dielectric substrate electrically continuous by a via, placing said cone/pyramid-shaped coil in the hole by directing a small-diameter side of said cone/pyramid-shaped coil toward the hole, electrically connecting the bottom of the hole and a tip-side lead wire extending from said cone/pyramid-shaped coil, to each other, and connecting an electrode on a large-diameter side of said cone/pyramid-shaped coil to an electrode on said dielectric substrate.

2. The coil package as claimed in claim 1, wherein the coil package has a shape of a leadless package for directly connecting a connecting portion of the back surface of said dielectric substrate and a connecting portion of a printed circuit board to each other.

3. The coil package as claimed in claim 1, wherein when said cone/pyramid-shaped coil is inserted into the hole and fixed thereto, said cone/pyramid-shaped coil is held at approximately 90° with respect to a microstrip line on a printed circuit board.

4. The coil package as claimed in claim 1, wherein a through-hole via is used as said electrode of said dielectric substrate to which is connected said electrode on the large-diameter side of said cone/pyramid-shaped coil.

5. The coil package as claimed in claim 1, wherein said via is connected to a transmission line which has a narrow width and is formed on the back surface of said dielectric substrate, and
    wherein a dielectric portion of said dielectric substrate on at least one of opposite sides of said transmission line is partially removed.

6. The coil package as claimed in claim 1, wherein said via is connected to a transmission line which has a narrow width and is formed on the back surface of said dielectric substrate, and
    wherein a dielectric portion of at least one of an input portion and an output portion of said transmission line on the back surface of said dielectric substrate is partially removed.

7. The coil package as claimed in claim 1, wherein said via to which is connected said tip-side lead wire from said cone/pyramid-shaped coil is formed as a through-hole, and
    wherein said tip-side lead wire is inserted into the through-hole to insert said tip portion of said cone/pyramid-shaped coil into the hole, whereby said tip-side lead wire and said via are electrically connected to each other from a back surface side of said dielectric substrate.

8. The coil package as claimed in claim 1, wherein a cutout is formed in said dielectric substrate, and
wherein said cone/pyramid-shaped coil is inserted into the cutout by directing the small-diameter side thereof toward the cutout, in a state tilted to a horizontal position, to connect between said tip-side lead wire and the bottom of the hole, and said cone/pyramid-shaped coil is raised upright after the connection, and fixed to said dielectric substrate, while being held in an upright position.

9. The coil package as claimed in claim 1, wherein solder balls are attached to portions of said dielectric substrate which are to be connected to said printed circuit board, and connection of said dielectric substrate to said printed circuit board is performed via the solder balls.

10. A bias tee package for supplying a high-frequency signal by superposing a DC component thereon, comprising:
a cone/pyramid-shaped coil having a conical or pyramidal shape formed by a conductor wire wound around an outer peripheral surface of a core in a manner such that a winding diameter of said coil progressively decreases from one end to the other end of said coil, said cone/pyramid-shaped coil eliminating high-frequency components of the DC component;
a capacitor for passing the high-frequency signal therethrough to eliminate low-frequency components; and
a dielectric substrate,
wherein said cone/pyramid-shaped coil, said capacitor, and said dielectric substrate are integrated with each other, by forming a hole in said dielectric substrate, for inserting a tip portion of said cone/pyramid-shaped coil, making a bottom of the hole and a back surface of said dielectric substrate electrically continuous by a first via, placing said cone/pyramid-shaped coil in the hole by directing a small-diameter side of said cone/pyramid-shaped coil toward the hole, electrically connecting the bottom of the hole and a tip-side lead wire extending from said cone/pyramid-shaped coil to each other, connecting an electrode on a large-diameter side of said cone/pyramid-shaped coil to an electrode on said dielectric substrate, cutting said dielectric substrate to form a cutout and disposing said capacitor in the cutout, and making opposite ends of said capacitor and the back surface of said dielectric substrate electrically continuous by a second via to thereby cause said tip-side lead wire and one end of said capacitor to be connected to each other.

11. The bias tee package as claimed in claim 10, wherein when said cone/pyramid-shaped coil is inserted into the hole and is fixed thereto, said cone/pyramid-shaped coil is held at approximately 90° with respect to a microstrip line on a printed circuit board.

\* \* \* \* \*